(12) United States Patent
Takahashi

(10) Patent No.: US 11,756,498 B2
(45) Date of Patent: Sep. 12, 2023

(54) SCAN SIGNAL LINE DRIVE CIRCUIT CAPABLE OF RESTRAINING INCREASED IN LINE MEMORY COUNT AND ACHIEVING SUITABLE DRIVING

(71) Applicant: SHARP KABUSHIKI KAISHA, Sakai (JP)

(72) Inventor: Yoshihisa Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/551,704

(22) Filed: Dec. 15, 2021

(65) Prior Publication Data

US 2022/0208137 A1   Jun. 30, 2022

Related U.S. Application Data

(60) Provisional application No. 63/130,616, filed on Dec. 25, 2020.

(51) Int. Cl.
*G09G 3/36* (2006.01)

(52) U.S. Cl.
CPC ... G09G 3/3677 (2013.01); *G09G 2310/0286* (2013.01)

(58) Field of Classification Search
CPC ...... G09G 3/36; G09G 3/3611; G09G 3/3614; G09G 3/3622; G09G 3/3625; G09G 3/3674; G09G 3/3677; G09G 3/3681; G09G 3/3685; G09G 3/3688; G09G 3/3692; G09G 3/3696; G09G 2310/0286

USPC .................................................. 345/87–104
See application file for complete search history.

(56) References Cited

U.S. PATENT DOCUMENTS

| | | | |
|---|---|---|---|
| RE43,850 E | 12/2012 | Kikuchi | |
| 10,840,795 B1* | 11/2020 | Nguyen | H02M 1/08 |
| 2002/0180005 A1* | 12/2002 | Haematsu | H01L 29/41758 257/E29.12 |
| 2005/0285824 A1* | 12/2005 | Shin | G11C 19/00 345/76 |
| 2006/0071890 A1 | 4/2006 | Kikuchi | |
| 2010/0134396 A1* | 6/2010 | Umezaki | G02F 1/13624 349/48 |

(Continued)

FOREIGN PATENT DOCUMENTS

| | | |
|---|---|---|
| JP | 2006-106394 A | 4/2006 |
| WO | 2011055584 A1 | 5/2011 |

*Primary Examiner* — Amit Chatly
*Assistant Examiner* — Nelson Lam
(74) *Attorney, Agent, or Firm* — ScienBiziP, P.C.

(57) ABSTRACT

A shift register circuit includes stages each including a unit circuit. The unit circuit includes: an output transistor; an internal node; and a set transistor. Two of the scan signal lines that are adjacent to each other are turned into a selected state for respective, but partially overlapping select periods. The internal node is precharged over a first precharge period by a first transistor that is the set transistor in the unit circuit in at least one of the stages. The internal node is precharged over a second precharge period by a second transistor that is the set transistor in the unit circuit in at least another one of the stages. The first precharge period is shorter than the second precharge period. The first transistor in some or all of the at least one of the stages has a higher current-drive capability than the second transistor.

18 Claims, 15 Drawing Sheets

(56) References Cited

U.S. PATENT DOCUMENTS

| | | | |
|---|---|---|---|
| 2011/0221736 A1* | 9/2011 | Pak | G09G 3/3677 |
| | | | 345/50 |
| 2012/0218245 A1 | 8/2012 | Morii et al. | |
| 2015/0243256 A1* | 8/2015 | Qi | G09G 3/3674 |
| | | | 345/99 |
| 2015/0371716 A1* | 12/2015 | Shao | G11C 19/287 |
| | | | 327/109 |
| 2016/0086562 A1* | 3/2016 | Tan | G11C 19/184 |
| | | | 345/215 |
| 2018/0090476 A1* | 3/2018 | Kamada | H01L 29/7787 |
| 2018/0374943 A1* | 12/2018 | Liu | H01L 29/7786 |
| 2020/0357326 A1* | 11/2020 | Lee | G09G 3/20 |
| 2021/0150969 A1* | 5/2021 | Xie | G11C 19/28 |

* cited by examiner

SCAN SIGNAL LINE DRIVE CIRCUIT CAPABLE OF RESTRAINING INCREASED IN LINE MEMORY COUNT AND ACHIEVING SUITABLE DRIVING

CROSS-REFERENCE TO RELATED APPLICATION

The present application claims priority from Provisional Application No. 63/130,616, the content to which is hereby incorporated by reference into this application.

BACKGROUND

1. Field

The present disclosure relates to scan signal line drive circuits and display devices.

2. Description of the Related Art

Drive circuits and other peripheral circuits may be monolithically (integrally) formed in the non-display area (or the "peripheral area") of an active matrix substrate. This monolithic provision of the peripheral circuitry enables reducing the width of the non-display area, thereby preparing a narrow frame, and also streamlining the packaging process, which in turn leads to cost reduction. For instance, gate driver circuits may be monolithically formed and source driver circuits may be mounted by a COG (chip-on-glass) technique, both in the non-display area. A monolithically formed gate driver circuit is called a GDM (gate driver monolithic) circuit. PCT International Application Publication No. WO2011/055584 discloses a liquid crystal display device including GDM circuits on an active matrix substrate.

Recent years have seen a push for higher definition and higher speed drive in display devices. To this end, GDM circuits are required that are capable of high driving capability. GDM circuits with low driving capability can cause undesirably insufficient charging of scan signal lines (gate bus lines) and pixels. Overlap scan drive is being suggested as a solution addressing this problem of insufficient charging of scan signal lines and pixels. An exemplary overlap scan drive technique is disclosed in Japanese Unexamined Patent Application Publication, Tokukai, No. 2006-106394. Overlap scan drive stretches the pulse widths of scan signals (i.e., extends select periods for scan signal lines) to such an extent that the select periods for adjacent scan signal lines partially overlap.

SUMMARY

When the pulse widths of scan signals are stretched as in overlap scan drive, the time lapse from the start of a frame to the writing in the first stage becomes longer, which necessitates additional line memory for retaining video signals at an extra cost. If the line memory count is restricted, the first-stage circuit in the GDM circuit may come short of providing sufficient driving capability, which could cause unstable panel operation as described later in detail.

The present invention, in an embodiment thereof, has been made in view of these issues and has an object to provide a scan signal line drive circuit capable of restraining increases in the line memory count and achieving suitable driving even when the pulse width of a scan signal is stretched.

The present specification discloses scan signal line drive circuits and display devices described in the following items.

Item 1

A scan signal line drive circuit that sequentially turns a plurality of scan signal lines in a display device into a selected state, the scan signal line drive circuit including a shift register circuit including a plurality of stages each including a unit circuit, the unit circuit including:
  an output transistor connected to an associated one of the plurality of scan signal lines to output a scan signal to that one of the plurality of scan signal lines;
  an internal node connected to a gate terminal of the output transistor; and
  a set transistor configured to precharge the internal node,
two of the plurality of scan signal lines that are adjacent to each other being turned into a selected state for respective, but partially overlapping select periods,
the internal node being precharged over a first precharge period by a first transistor that is the set transistor in the unit circuit in at least one of the plurality of stages,
the internal node being precharged over a second precharge period by a second transistor that is the set transistor in the unit circuit in at least another one of the plurality of stages, the first precharge period being shorter than the second precharge period,
the first transistor in some or all of the at least one of the plurality of stages having a higher current-drive capability than the second transistor.

Item 2

The scan signal line drive circuit of item 1, wherein
the first precharge period is x times the second precharge period, where x is greater than 0 and less than 1, and letting $L_{MB1}$ and $W_{MB1}$ represent a channel length and a channel width respectively of the first transistor that has a higher current-drive capability than the second transistor and $L_{MB2}$ and $W_{MB2}$ represent a channel length and a channel width respectively of the second transistor, a relation given below is substantially satisfied:

$$x = (L_{MB1}/L_{MB2}) \times (W_{MB2}/W_{MB1}).$$

Item 3

The scan signal line drive circuit of item 1 or 2, wherein
the second transistor and the first transistor that has a higher current-drive capability than the second transistor have substantially equal channel lengths, and
the first transistor that has a higher current-drive capability than the second transistor has a larger channel width than the second transistor.

Item 4

The scan signal line drive circuit of any of items 1 to 3, wherein
the plurality of stages is arranged in a first direction,
the first transistor that has a higher current-drive capability than the second transistor has a different dimension in the first direction than does the second transistor in the first direction, and
the second transistor and the first transistor that has a higher current-drive capability than the second transistor have substantially equal dimensions in a second direction that is substantially perpendicular to the first direction.

Item 5
The scan signal line drive circuit of item 4, wherein
the first transistor and the second transistor each have a source terminal and a drain terminal, each of the source terminals and the drain terminals having a comb-teeth structure including a main portion extending in the second direction and a plurality of branch portions extending off the main portion in the first direction,
the plurality of branch portions of each of the source terminals and the drain terminals has a length termed a tooth length and a total number termed a tooth count,
the tooth count in the first transistor that has a higher current-drive capability than the second transistor is equal to the tooth count in the second transistor, and
the tooth length in the first transistor that has a higher current-drive capability than the second transistor differs from the tooth length in the second transistor.

Item 6
The scan signal line drive circuit of item 4, wherein
the first transistor and the second transistor each have a source terminal and a drain terminal, each of the source terminals and the drain terminals having a comb-teeth structure including a main portion extending in the first direction and a plurality of branch portions extending off the main portion in the second direction,
the plurality of branch portions of each of the source terminals and the drain terminals has a length termed a tooth length and a total number termed a tooth count,
the tooth length in the first transistor that has a higher current-drive capability than the second transistor is equal to the tooth length in the second transistor, and
the tooth count in the first transistor that has a higher current-drive capability than the second transistor differs from the tooth count in the second transistor.

Item 7
The scan signal line drive circuit of any of items 1 to 6, wherein a common gate start pulse signal is fed as a set signal to the set transistors including the first transistor.

Item 8
The scan signal line drive circuit of any of items 1 to 7, wherein
the first transistor is the set transistor in the unit circuit in a first one of the plurality of stages, and
the second transistor is the set transistor in each unit circuit in second and subsequent ones of the plurality of stages.

Item 9
The scan signal line drive circuit of item 8, wherein
the select period is equal to two horizontal scan periods,
the first precharge period is equal to one horizontal scan period, and
the second precharge period is equal to two horizontal scan periods.

Item 10
The scan signal line drive circuit of any of items 1 to 7, wherein the internal node is precharged over a third precharge period by a third transistor that is the set transistor in the unit circuit in at least yet another one of the plurality of stages, the second precharge period being shorter than the third precharge period.

Item 11
The scan signal line drive circuit of item 10, wherein
the first transistor is the set transistor in the unit circuit in a first one of the plurality of stages,
the second transistor is the set transistor in the unit circuit in a second one of the plurality of stages,
the third transistor is the set transistor in each unit circuit in third and subsequent ones of the plurality of stages, and
the second transistor has a higher current-drive capability than the third transistor.

Item 12
The scan signal line drive circuit of item 11, wherein
the select period is equal to three horizontal scan periods,
the first precharge period is equal to one horizontal scan period,
the second precharge period is equal to two horizontal scan periods, and
the third precharge period is equal to three horizontal scan periods.

Item 13
The scan signal line drive circuit of item 10, wherein
the first transistor is the set transistor in the unit circuit in a first one of the plurality of stages,
the second transistor is the set transistor in each unit circuit in second, fourth, and subsequent ones of the plurality of stages,
the third transistor is the set transistor in the unit circuit in a third one of the plurality of stages, and
the third transistor has a lower current-drive capability than the second transistor.

Item 14
The scan signal line drive circuit of item 13, wherein
the select period is equal to three horizontal scan periods,
the first precharge period is equal to two horizontal scan periods,
the second precharge period is equal to three horizontal scan periods, and
the third precharge period is equal to four horizontal scan periods.

Item 15
The scan signal line drive circuit of item 10, wherein the second transistor and the third transistor have substantially equal current-drive capabilities.

Item 16
The scan signal line drive circuit of any of items 1 to 15, the scan signal line drive circuit being provided monolithically to a substrate in the display device.

Item 17
A display device including the scan signal line drive circuit of any of items 1 to 16.

The present invention, in an embodiment thereof, can provide a scan signal line drive circuit capable of restraining increases in the line memory count and achieving suitable driving even when the pulse width of a scan signal is stretched.

DESCRIPTION OF EMBODIMENTS

The following will describe embodiments of the present invention with reference to drawings. The description below will give the liquid crystal display device as an example of display devices in accordance with the embodiments of the present invention. The display devices in accordance with the embodiments of the present invention are however not necessarily limited to liquid crystal display devices.

Embodiment 1

Overall Configuration] of Liquid Crystal Display Device

Figure 1:
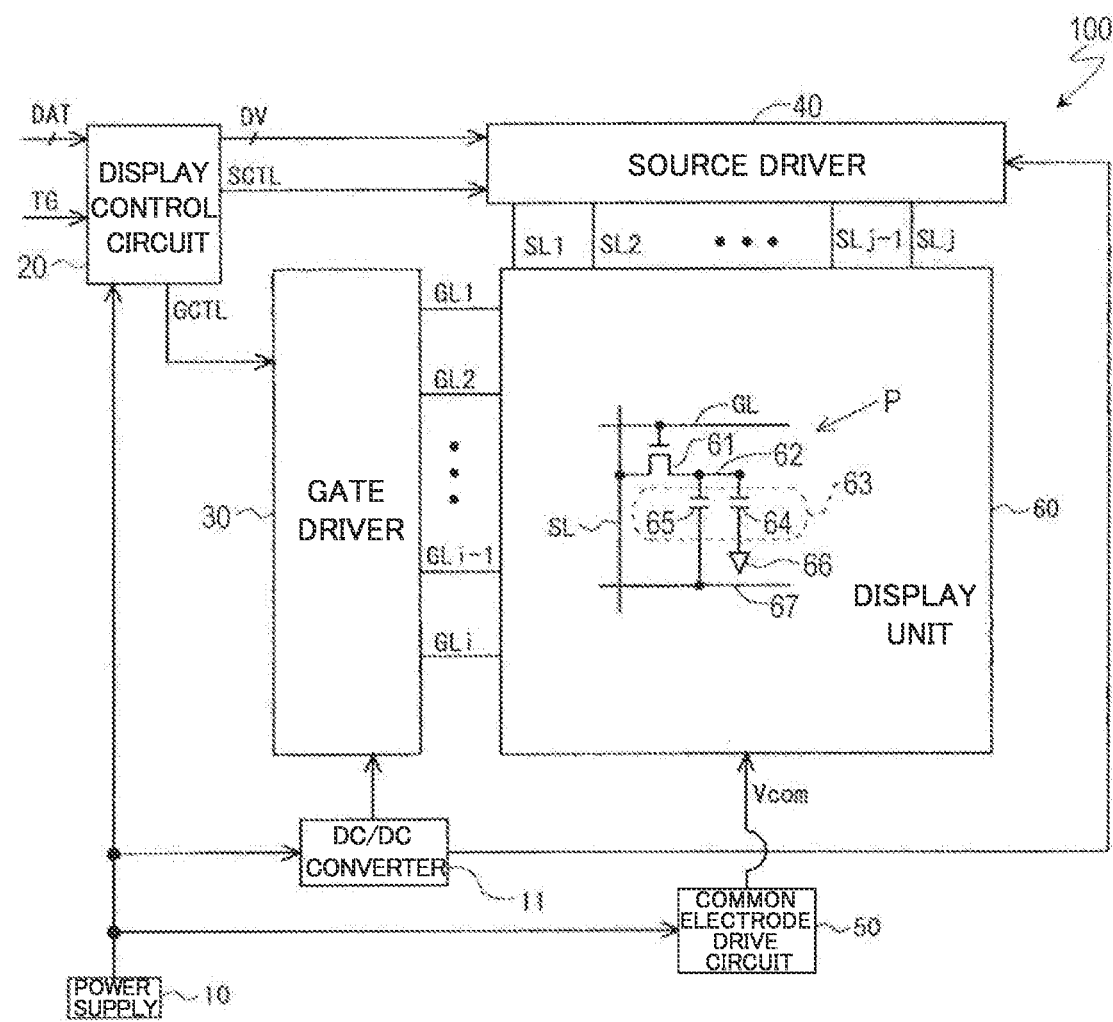
FIG. 1 is a block diagram of an exemplary overall configuration of a liquid crystal display device 100 in accordance with Embodiment 1.

Referring to FIG. 1, a description is given of a liquid crystal display device 100 in accordance with the present embodiment. FIG. 1 is a block diagram of an exemplary overall configuration of the liquid crystal display device 100.

The liquid crystal display device 100 includes a power supply 10, a DC/DC converter 11, a display control circuit 20, a gate driver (scan signal line drive circuit) 30, a source driver (video signal line drive circuit) 40, a common electrode drive circuit 50, and a display unit 60, as shown in FIG. 1. In this example, the liquid crystal display device 100 further includes a liquid crystal display panel (not shown) that in turn includes: an active matrix substrate; an opposite substrate opposite the active matrix substrate; and a liquid crystal layer between these substrates. The gate driver 30 is formed monolithically to the active matrix substrate. In other words, the gate driver 30 is a GDM circuit.

The display unit 60 includes a plurality of row-wise gate bus lines (scan signal lines) GL1 to GLi (i gate bus lines) and a plurality of column-wise source bus lines (video signal line) SL1 to SLj (j source bus lines). The rows run perpendicular to the columns. The display unit 60 further includes an i-by-j matrix of pixels P. An equivalent circuit of the pixel P is shown inside the display unit 60 in FIG. 1.

Each pixel P includes a thin film transistor (TFT) 61 and a pixel electrode 62. The TFT 61 has the gate and source electrodes thereof connected to an associated one of the gate bus lines GL and an associated one of the source bus lines SL respectively. The TFTs 61 has the drain electrode thereof connected to the pixel electrode 62. A pixel capacitor 63 is composed of a liquid crystal capacitor 64 and an auxiliary capacitor 65 electrically connected in parallel with the liquid crystal capacitor 64. The liquid crystal capacitor 64 includes: the pixel electrode 62; a common electrode 66 opposite the pixel electrode 62; and a liquid crystal layer between these electrodes. The auxiliary capacitor 65 includes: the pixel electrode 62; an auxiliary capacitor electrode 67 opposite the pixel electrode 62; and an insulation layer between these electrodes.

The power supply 10 feeds a prescribed power supply voltage to the DC/DC converter 11, the display control circuit 20, and the common electrode drive circuit 50. The DC/DC converter 11 generates a prescribed DC voltage from the power supply voltage to power the gate driver 30 and the source driver 40 and feeds this prescribed DC voltage to the gate driver 30 and the source driver 40. The common electrode drive circuit 50 feeds a prescribed a common potential Vcom to the common electrode 66.

The display control circuit 20 externally receives an image signal DAT and a group of timing signals TG such as a horizontal synchronization signal and a vertical synchronization signal and outputs a digital video signal DV, gate control signals GCTL for controlling the operations of the gate driver 30, and source control signals SCTL for controlling the operations of the source driver 40. The gate control signals GCTL typically include, for example, a gate start pulse signal and a gate clock signal. The source control signals SCTL typically include, for example, a source start pulse signal, a source clock signal, and a latch strobe signal.

The gate driver 30 drives the gate bus lines GL1 to GLi. Specifically, the gate driver 30 sequentially selects the gate bus lines GL1 to GLi (supplies a HIGH scan signal to the gate bus lines GL1 to GLi). More specifically, the gate driver 30 repeatedly supplies a scan signal to the gate bus lines GL with a cycle of one vertical scan period on the basis of the gate control signals GCTL supplied from the display control circuit 20. The gate driver 30 will be detailed later.

The source driver 40 drives the source bus lines SL1 to SLj. Specifically, the source driver 40 receives the digital video signal DV and the source control signals SCTL supplied from the display control circuit 20 and supplies driving video signals to the source bus lines SL. In so doing, in the source driver 40, the digital video signal DV representing the voltages to be applied to the source bus lines SL is sequentially retained upon the generation of source clock signal pulses. Then, upon the generation of latch strobe signal pulses, the retained digital video signal DV is converted to analog voltages that are simultaneously applied to all the source bus lines SL as the driving video signals.

By applying scan signals to the gate bus lines GL1 to GLi and driving video signals to the source bus lines SL1 to SLj as described here, an image is displayed on the display unit 60 based on the externally fed image signal DAT.

Structure and Operation of Gate Driver

Figure 2:
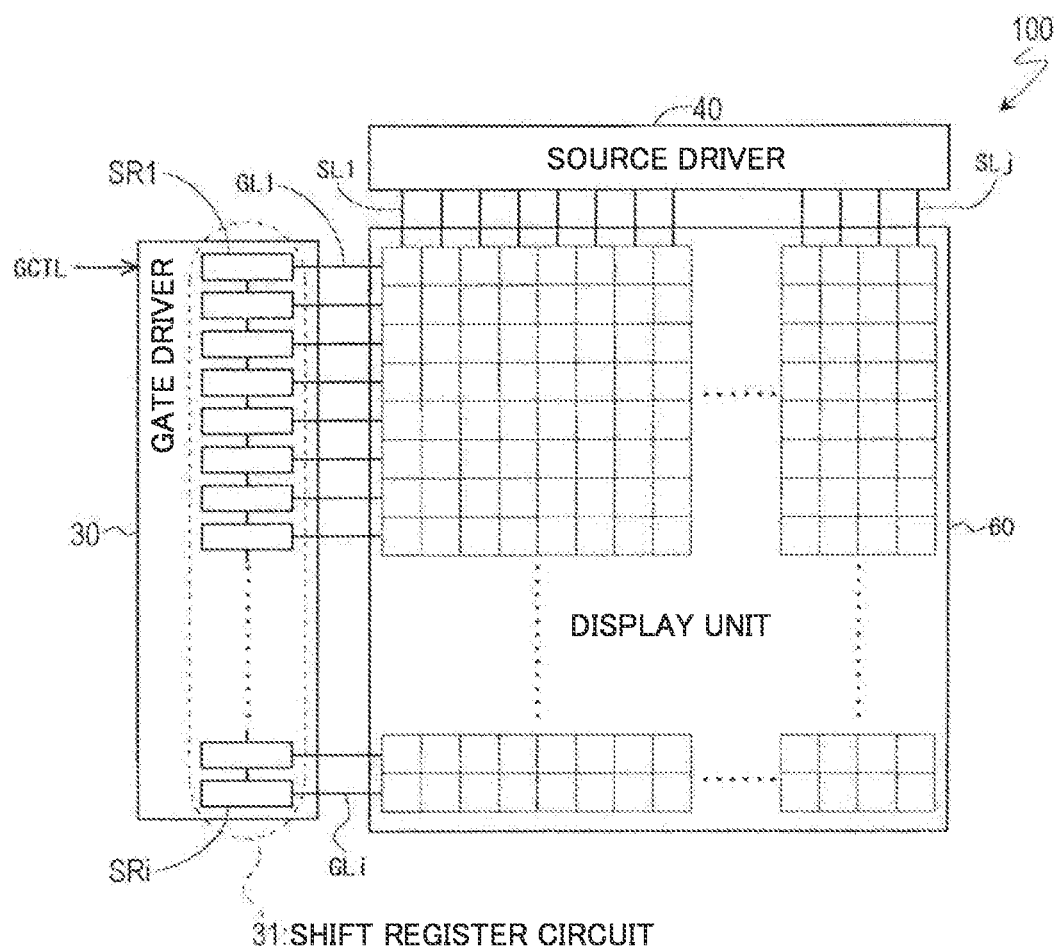
FIG. 2 is a block diagram of a structure of a gate driver 30 in the liquid crystal display device 100.
Figure 3:
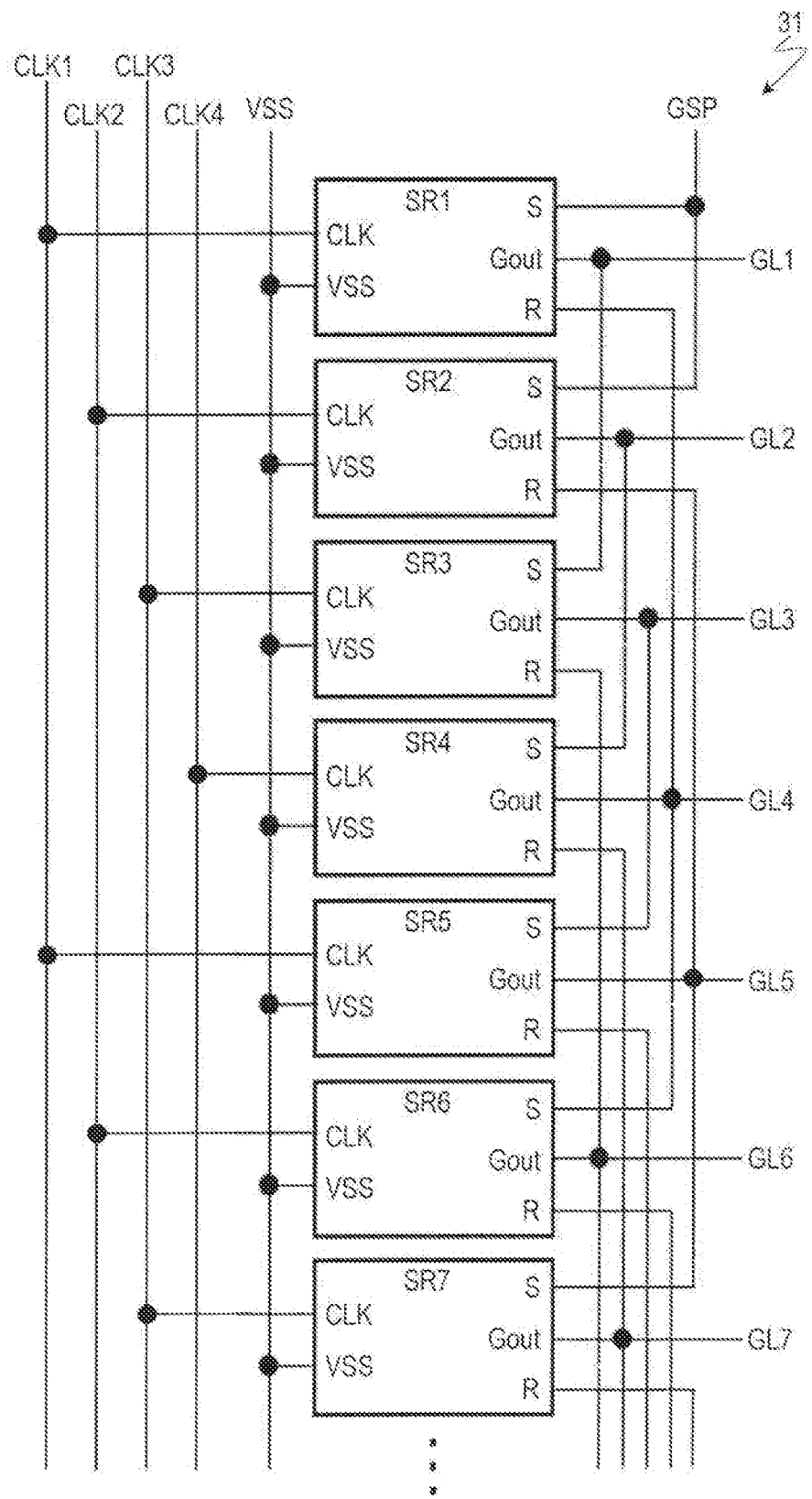
FIG. 3 is a block diagram of a structure of a shift register circuit 31 in the gate driver 30.

Referring to FIGS. 2 and 3, a description is now given of the structure and operation of the gate driver 30. FIG. 2 is a block diagram of a structure of the gate driver 30. FIG. 3 is a block diagram of a structure of a shift register circuit 31 in the gate driver 30.

Referring to FIG. 2, the gate driver 30 includes the shift register circuit 31 that in turn includes a plurality of stages (in this example, i stages). The stages are arranged along the column direction. Each stage includes a unit circuit SR. In other words, the shift register circuit 31 includes a plurality of unit circuits SR1 to SRi (in this example, i unit circuits).

FIG. 3 is a block diagram of a structure of the shift register circuit 31. FIG. 3 shows the unit circuits SR1 to SR7 in the first to seventh stages from the plurality of unit circuits SR1 to SRi in the shift register circuit 31. Each unit circuit SR includes: an input terminal for receiving gate clock signals CLK; an input terminal for receiving a set signal S; an input terminal for receiving a reset signal R; an input terminal for receiving a LOW-level DC power supply potential VSS; and an output terminal for outputting a scan signal Gout.

The shift register circuit 31 is fed with four-phase clock signals CLK1 to CLK4 as the gate clock signals CLK. In this example, the clock signals CLK1 to CLK4 toggle repeatedly between a HIGH potential (VDD) and a LOW potential (VSS) every two horizontal scan periods (2H) and have respective phases that differ by a quarter of the cycle (90°) (see FIG. 6). In other words, each stage in the shift register circuit 31 selects an associated one of the gate bus lines GL for a select period that is longer than one horizontal scan period (in this example, the select period is equal to two horizontal scan periods).

A description is given next of input/output signals for each stage (each unit circuit SR) in the shift register circuit 31. Each unit circuit SR is fed with the gate clock signal CLK as in the following. The unit circuit SR1 in the first stage is fed with the clock signal CLK1, the unit circuit SR2 in the second stage is fed with the clock signal CLK2, the unit circuit SR3 in the third stage is fed with the clock signal CLK3, and the unit circuit SR4 in the fourth stage is fed with the clock signal CLK4. The same configuration repeats every four stages throughout the rest of the shift register circuit 31.

Each unit circuit SR outputs the scan signal Gout. To each unit circuit SR3 to SRi in the third and subsequent stages, the scan signal Gout outputted from the second previous stage is supplied as the set signal S. Meanwhile, a gate start pulse signal GSP is supplied to the unit circuits SR1 and SR2 in the first and second stages as the set signal S. To the unit circuit SR in each stage, the scan signal Gout outputted from the third succeeding stage is supplied as the reset signal R.

Structure of Unit Circuit

Figure 4:
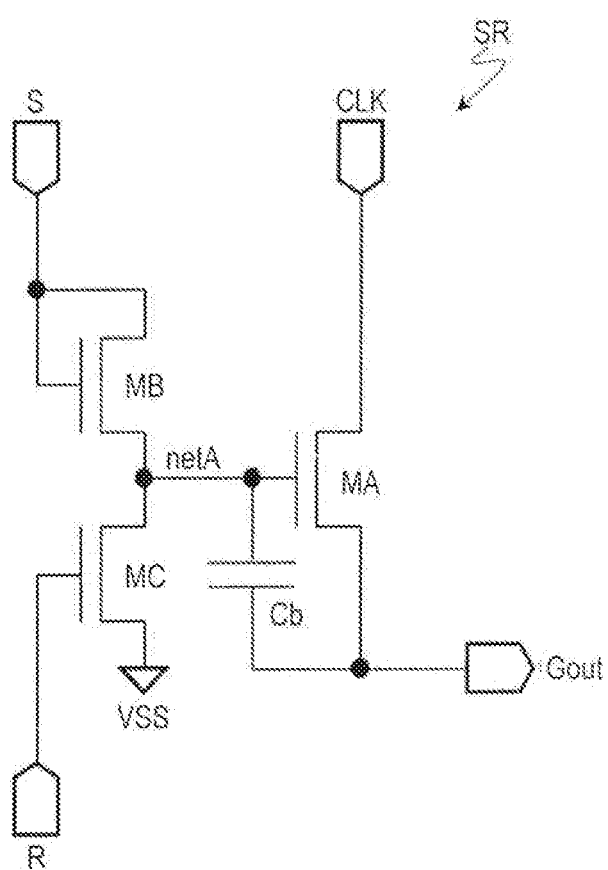
FIG. 4 is a circuit diagram of an exemplary structure of a unit circuit SR (structure of an individual stage in the shift register circuit 31).

FIG. 4 is a circuit diagram of an exemplary structure of the unit circuit SR (structure of an individual stage in the shift register circuit 31). The example in FIG. 4 shows the unit circuit SR including three thin film transistors (TFTs) MA, MB and MC and a single capacitor Cb. The unit circuit SR, as described earlier, includes an input terminal for the gate clock signal CLK, an input terminal for the set signal S, an input terminal for the reset signal R, an input terminal for the LOW-level DC power supply potential VSS, and an output terminal for the scan signal Gout.

The gate terminal of the thin film transistor MA, the source terminal of the thin film transistor MB, the drain terminal of the thin film transistor MC, and one of the two terminals of the capacitor Cb are interconnected via an internal node netA.

The thin film transistor MA has the gate, drain, and source terminals thereof connected respectively to the internal node netA, the input terminal for the gate clock signal CLK, and the output terminal for the scan signal Gout. The thin film transistor MA is connected to an associated one of the gate bus lines GL, serving as an output transistor for supplying the scan signal Gout to that gate bus line GL.

The thin film transistor MB has the gate and drain terminals thereof connected to the input terminal for the set signal S (i.e., diode connected). The thin film transistor MB has the source terminal thereof connected to the internal node netA. The thin film transistor MB serves as a set transistor for precharging (raising the voltage on) the internal node netA.

The thin film transistor MC has the gate, drain, and source terminals thereof connected respectively to the input terminal for the reset signal R, the internal node netA, and the input terminal for the LOW-level DC power supply potential VSS. The thin film transistor MC serves as a reset transistor for lowering the voltage on the internal node netA.

The capacitor Cb has one of the two terminals thereof connected to the internal node netA and the other terminal thereof connected to the source terminal of the output transistor MA. The capacitor Cb retains the voltage on the internal node netA precharged by the set transistor MB.

The active layers in the output transistor MA, the set transistor MB, and the REset transistor MC may be made of various, publicly known semiconductor materials.

Operation of Unit Circuit

Figure 5:
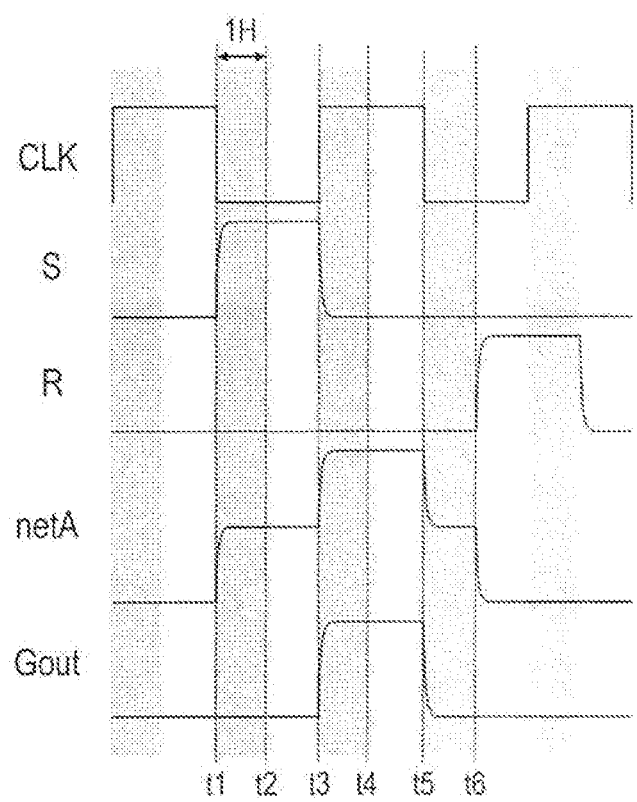
FIG. 5 is a timing chart illustrating how the unit circuit SR operates.

Referring to FIG. 5, a description is now given of the operation of the unit circuit SR. FIG. 5 is a timing chart illustrating how the unit circuit SR operates. FIG. 5 shows the voltage levels of the gate clock signal CLK, the set signal S, the reset signal R, the internal node netA, and the scan signal Gout. "1H" in FIG. 5 indicates one horizontal scan period.

Referring to FIG. 5, prior to time t1, the voltage levels of the set signal S, the internal node netA, and the scan signal Gout stay LOW. At time t1, the set signal S changes from LOW to HIGH, turning on the set transistor MB and hence charging the capacitor Cb and raising the voltage on the internal node netA over the period from t1 to t3.

At time t3, the gate clock signal CLK changes from LOW to HIGH, which raises the drain voltage of the output transistor MA. Because the output transistor MA is ON under these conditions, the voltage level of the scan signal Gout (the voltage on the output terminal) rises. As the voltage on the output terminal rises, the voltage on the internal node netA further rises through the capacitor Cb (the internal node netA is boosted). As a result, an increased voltage is applied to the gate terminal of the output transistor MA. Accordingly, the HIGH gate clock signal CLK is fed as is to the output terminal via the output transistor MA, and the scan signal Gout therefore goes HIGH. The scan signal Gout then remains HIGH until time t5. At time t3, the set signal S changes from HIGH to LOW, turning off the set transistor MB.

The gate clock signal CLK changes from HIGH to LOW at time t5. Because the output transistor MA is ON under these conditions, the drain voltage (voltage on the input terminal for the gate clock signal CLK) drops, and accordingly the voltage level of the scan signal Gout (voltage on the output terminal) drops. This drop in the voltage on the output terminal lowers the voltage on the internal node netA via the capacitor Cb.

At time t6, the reset signal R changes from LOW to HIGH, turning on the reset transistor MC and hence bringing down the voltage on the internal node netA to LOW.

Figure 6:
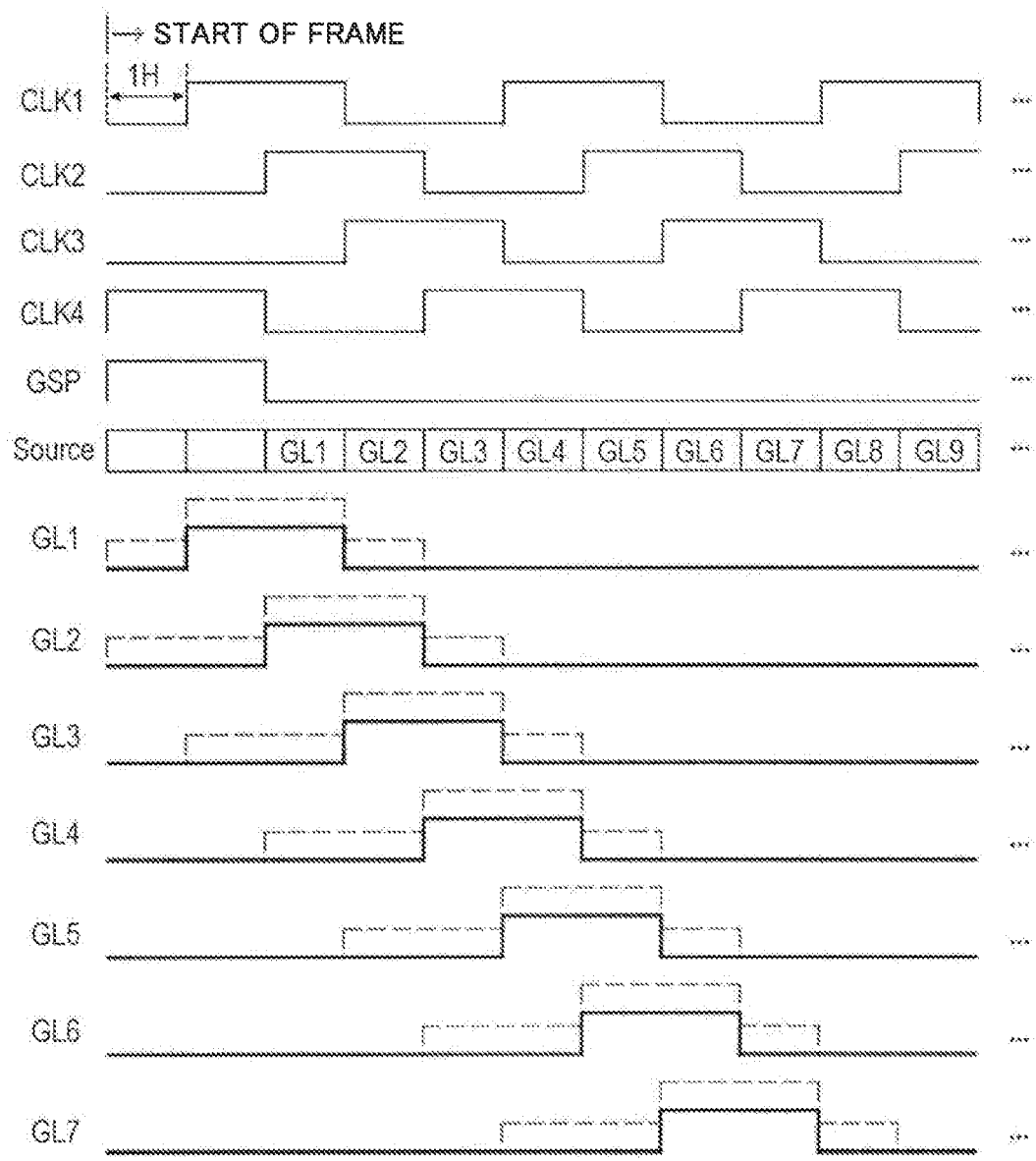
FIG. 6 is a timing chart illustrating how the gate driver 30 operates.

FIG. 6 is a timing chart illustrating how the gate driver 30 including the unit circuits SR1 to SRi operates. FIG. 6 shows the voltage levels of the clock signals CLK1 to CLK4, the gate start pulse signal GSP, a source signal (driving video signal; denoted by "Source" in FIG. 6), and the voltage levels of the scan signals Gout applied to the gate bus lines GL1 to GL7. The voltage on the internal node netA is indicated by a broken line alongside the voltage of the scan signal Gout.

As can be seen from FIG. 6, the select period over which each gate bus line GL remains selected is longer than one horizontal scan period and equal to two horizontal scan periods, so that the select periods for every two adjacent gate bus lines GL partially (one horizontal scan period) overlap.

In addition, as can be seen from FIG. 6, the period over which the internal node netA in the unit circuit SR1 in the first stage is precharged by the set transistor MB (referred to as the "first precharge period") is shorter than the period over which the internal node netA in each unit circuit SR2 to SRi in the second and subsequent stages is precharged by the set transistor MB (referred to as the "second precharge period"). Specifically, the second precharge period is equal to two horizontal scan periods, and the first precharge period is equal to one horizontal scan period. Note throughout the specification of the present application that the precharge period for a majority of the stages (the second precharge period in the present embodiment) may be referred to as the "ordinary precharge period," that the stages for which the precharge period is equal to the ordinary precharge period may be referred to as the "ordinary stages," and that the stages for which the precharge period is not equal to the ordinary precharge period may be referred to as the "non-ordinary stages."

Current-Drive Capability of Set Transistor

The set transistor MB in the unit circuit SR1 in the first stage differs in current-drive capability from the set transistors MB in the unit circuits SR2 to SRi in the second and subsequent stages in the present embodiment. Specifically, the current-drive capability of the set transistor MB in the first stage is higher than the current-drive capabilities of the set transistors MB in the second and subsequent stages. A specific structure will be described later that imparts a higher current-drive capability to the set transistor MB in the first stage than to the set transistors MB in the second and subsequent stages.

Effects

The liquid crystal display device 100 in accordance with the present embodiment is driven by overlap scan drive where the pulse width of the scan signal Gout is stretched as described above. This particular configuration can address the problem of insufficient charging of the gate bus lines GL and the pixels P.

Figure 7:
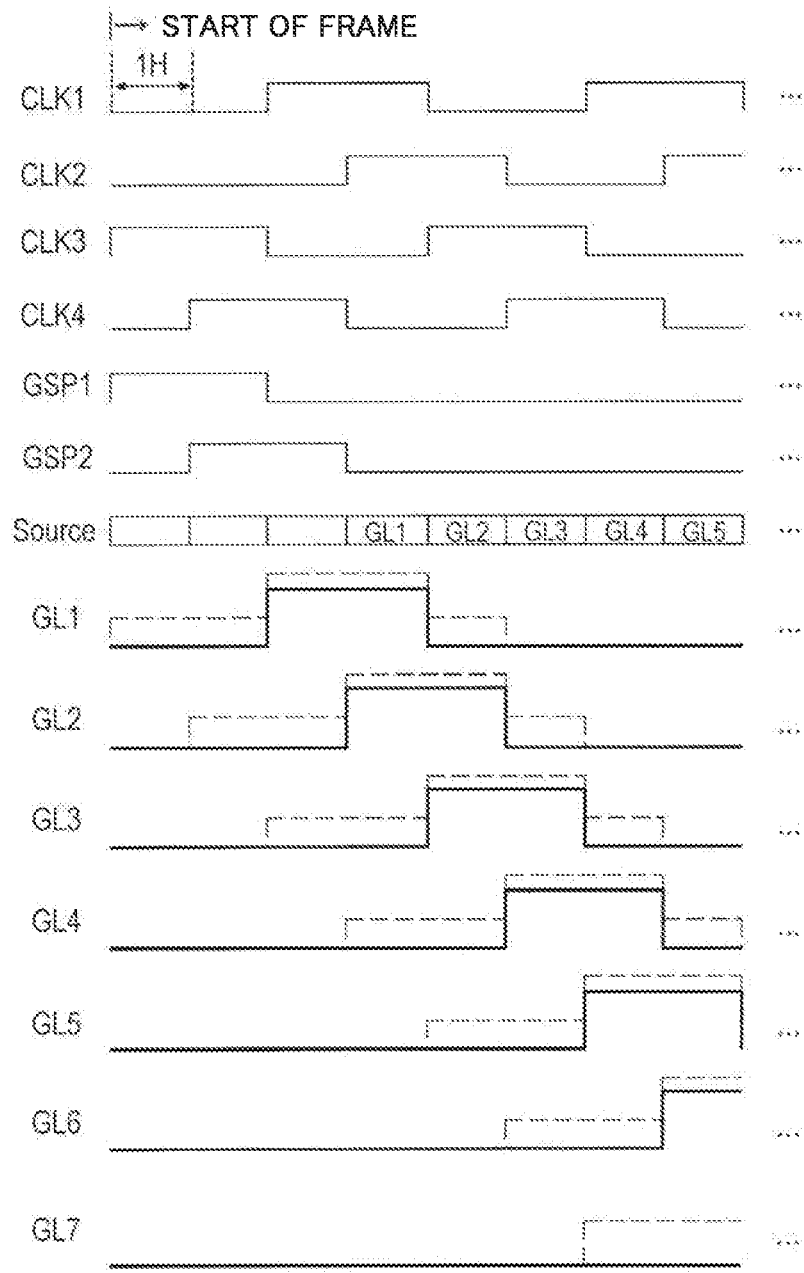
FIG. 7 is a timing chart illustrating simple overlap scan drive when the select period is equal to two horizontal scan periods.

The precharge period for the internal node netA in the first stage in (first precharge period) is shorter than the precharge period for each internal node netA in the second and subsequent stages (second precharge period) in the liquid crystal display device 100 in accordance with the present embodiment. FIG. 7 is a timing chart illustrating simple overlap scan drive. The timing chart in FIG. 7 shows the precharge period for the internal node netA having the same duration in all stages (equal to two horizontal scan periods). A comparison of FIGS. 6 and 7 demonstrates that this particular configuration of the present embodiment where the precharge period for the internal node netA in the first stage (first precharge period) is shorter than the precharge period for each internal node netA in the second and subsequent stages (second precharge periods) can shorten the time lapse from the start of a frame to the writing of a source signal in the first stage. The configuration can therefore restrain increases in the line memory count.

In the timing chart in FIG. 7, a gate start pulse signal GSP1 and a gate start pulse signal GSP2 need to be used for the first stage and the second stage respectively. In contrast, in the present embodiment, the single gate start pulse signal GSP can drive both the first stage and the second stage because the set signal S goes HIGH (precharging is started) at the same timing in the first and second stages. In other words, a plurality of set transistors including the set transistor in the first stage is fed commonly with the gate start pulse signal GSP serving as the set signal S.

Figure 8A:
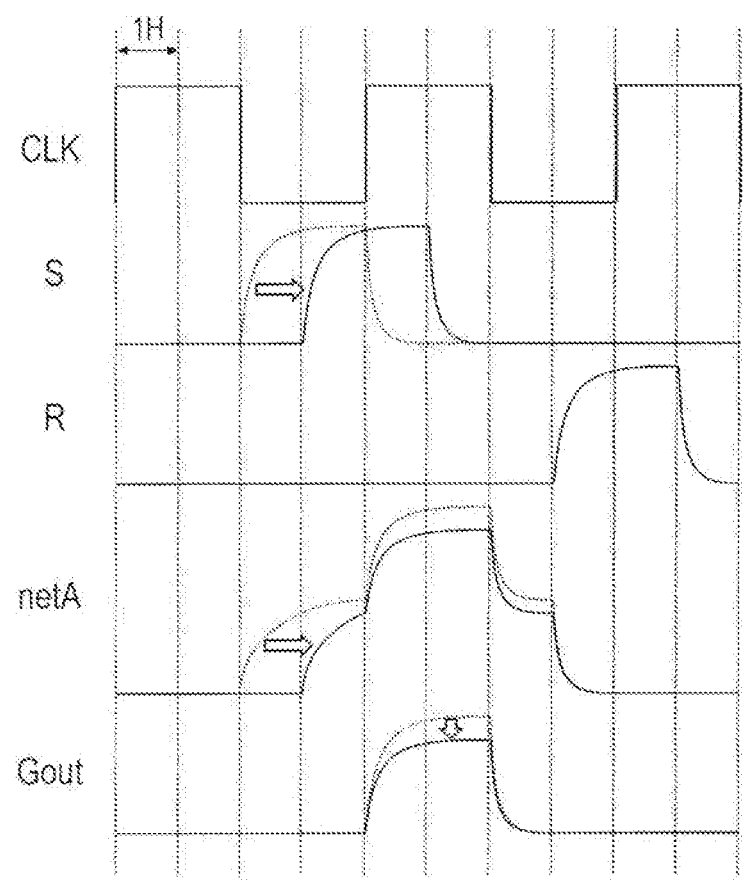
FIG. 8A is a timing chart illustrating an undesirable, insufficient voltage rise that may occur when the precharge period is shortened.
Figure 8B:
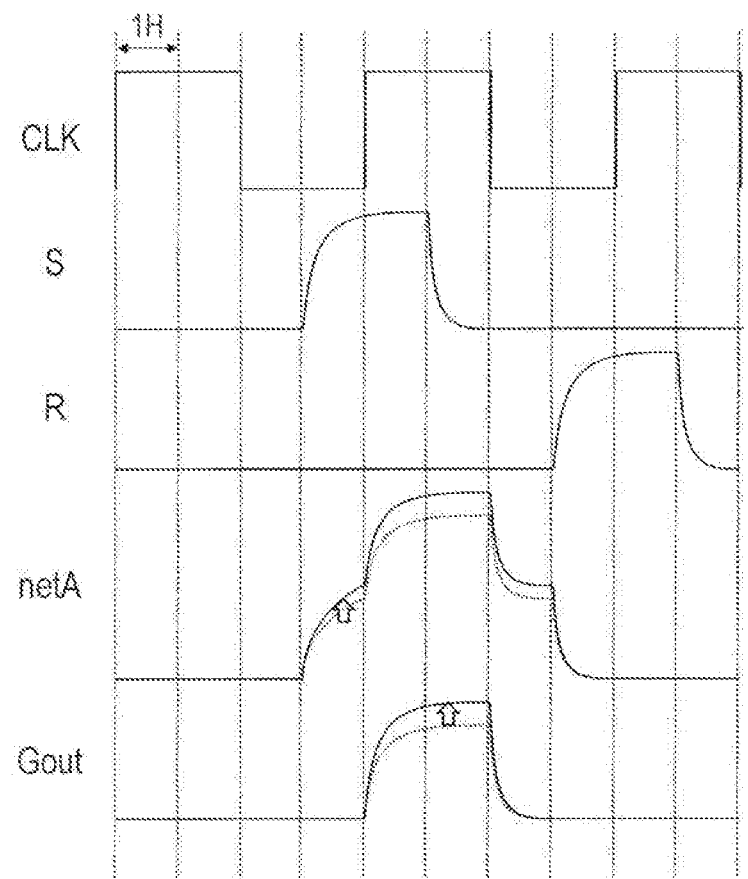
FIG. 8B is a timing chart illustrating how the problem of insufficient voltage rise is addressed in an embodiment of the present invention.

Shortening the precharge period for the first stage (first precharge period) can cause an undesirable, insufficient voltage rise in precharging and a poor output level of the scan signal Gout as shown in FIG. 8A. In contrast, in the liquid crystal display device 100 in accordance with the present embodiment, the current-drive capability of the set transistor MB in the unit circuit SR1 in the first stage is higher than the current-drive capabilities of the set transistors MB in the unit circuits SR2 to SRi in the second and subsequent stages. This particular configuration can sufficiently raise the voltage on the internal node netA, thereby maintaining the output level of the scan signal Gout, even when the precharge period is short, as shown in FIG. 8B.

Structure of Set Transistor

A description is now given of a specific structure that imparts a higher current-drive capability to the set transistor MB in the first stage than to the set transistor MB in the second stage.

Letting Q represent the quantity of charge that can be stored per unit time on the internal node netA in the set transistor MB for convenience, the quantity of charge Q is generally inversely proportional to the channel length and generally proportional to the channel width of the set transistor MB. Therefore, letting $L_{MB1}$ and $W_{MB1}$ represent the channel length and the channel width respectively of the set transistor MB in the first stage and $L_{MB2}$ and $W_{MB2}$ represent the channel length and the channel width respectively of the set transistor MB in another stage (second or subsequent stage) when the precharge period for the internal node netA in the first stage is x times the precharge period for the internal node netA in the other stage, where x is greater than 0 and less than 1, it is preferable to set $L_{MB1}$ and $W_{MB1}$ so as to satisfy equation (1) below.

$$x=(L_{MB1}/L_{MB2})\times(W_{MB2}/W_{MB1}) \quad (1)$$

For instance, when the precharge period for the internal node netA in the first stage is half the precharge period for the internal node netA in another stage, the set transistor MB in the first stage can raise the voltage on the internal node netA to the same level as in the other stage if the set transistor MB in the first stage is capable of charging the internal node netA with electric charge $Q1=2\times Q$ per unit time. By setting $L_{MB1}$ and $W_{MB1}$ so as to satisfy $\frac{1}{2}=(L_{MB1}/L_{MB2})\times(W_{MB2}/W_{MB1})$, the desired quantity of charge Q1 can be achieved.

The set transistor MB in the first stage preferably has substantially the same channel length as the set transistors MB in the second and subsequent stages and a larger channel width than the set transistors MB in the second and subsequent stages. In other words, to adjust the current-drive capability of a particular one of the set transistors MB, it is preferable to change the channel width thereof without having to change the channel length thereof. If the channel length of a TFT is changed, the TFT is more likely to be affected by irregularities that can occur in pattern formation in the manufacture thereof, and the threshold voltage Vth, which is a property of the TFT, can also change. For these reasons, when the current-drive capability is to be adjusted, precise control can be achieved by changing the channel width without having to change the channel length.

Figure 9:
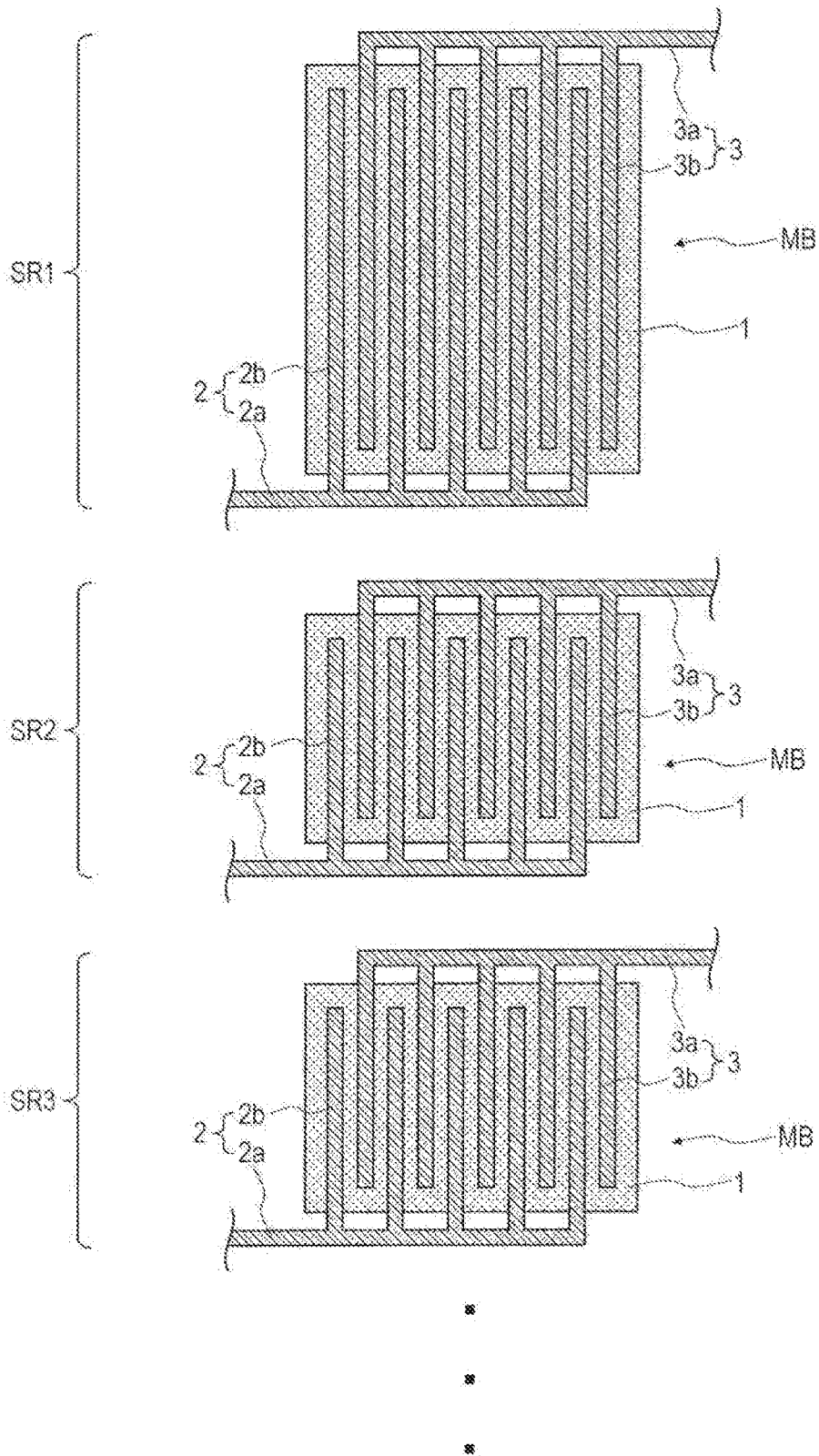
FIG. 9 is a diagram showing an exemplary arrangement of a set transistor MB.

FIG. 9 shows an exemplary arrangement of the set transistor MB. The plurality of stages (unit circuits SR1 to SRi) in the shift register circuit 31 is arranged in the column direction. FIG. 9 only shows the set transistor MB in each unit circuit SR.

The set transistor MB in each unit circuit SR includes a gate terminal (gate electrode) 1, a drain terminal (drain electrode) 2, and a source terminal (source electrode) 3. Both the drain terminal 2 and the source terminal 3 have a comb-teeth structure. The drain terminal 2 includes a main portion 2a extending in the row direction and a plurality of branch portions (comb-teeth portions) 2b extending off the main portion 2a in the column direction. The source terminal 3 includes a main portion 3a extending in the row direction and a plurality of branch portions (comb-teeth portions) 3b extending off the main portion 3a in the column direction. The drain terminal 2 and the source terminal 3 are disposed such that the comb-teeth portions 2b and 3b thereof alternate with each other.

Referring to FIG. 9, in the column direction, the set transistor MB in the first stage has a different dimension than the set transistors MB in the second and subsequent stages. Specifically, the set transistor MB in the first stage has a larger column-wise dimension than the set transistors MB in the second and subsequent stages. In addition, in the row direction (direction substantially perpendicular to the column direction), the set transistor MB in the first stage has substantially the same dimension as the set transistors MB in the second and subsequent stages.

If the channel width of a particular one of the set transistors MB is changed to adjust the current-drive capability thereof, the dimensions of the set transistor MB are inevitably also changed. When the set transistor MB in the first stage and the set transistors MB in the second and subsequent stages have substantially the same dimension in the row direction as shown in the example in FIG. 9, the layout can be easily designed because the periodicity of the layout pattern is least disturbed. Additionally, inspection can be performed with a minimum decrease in the inspect precision that may be caused by the disturbed periodicity.

The lengths of the comb-teeth portions 2b and 3b of the drain terminal 2 and the source terminal 3 will be referred to as the "tooth lengths." The total number of the comb-teeth portions 2b and 3b of the drain terminal 2 and the source terminal 3 will be referred to as the "tooth count."

In the example shown in FIG. 9, the set transistor MB in the first stage has a larger channel width than the set transistors MB in the second and subsequent stages because the set transistor MB in the first stage has a larger tooth length than the set transistors MB in the second and subsequent stages.

Figure 10:
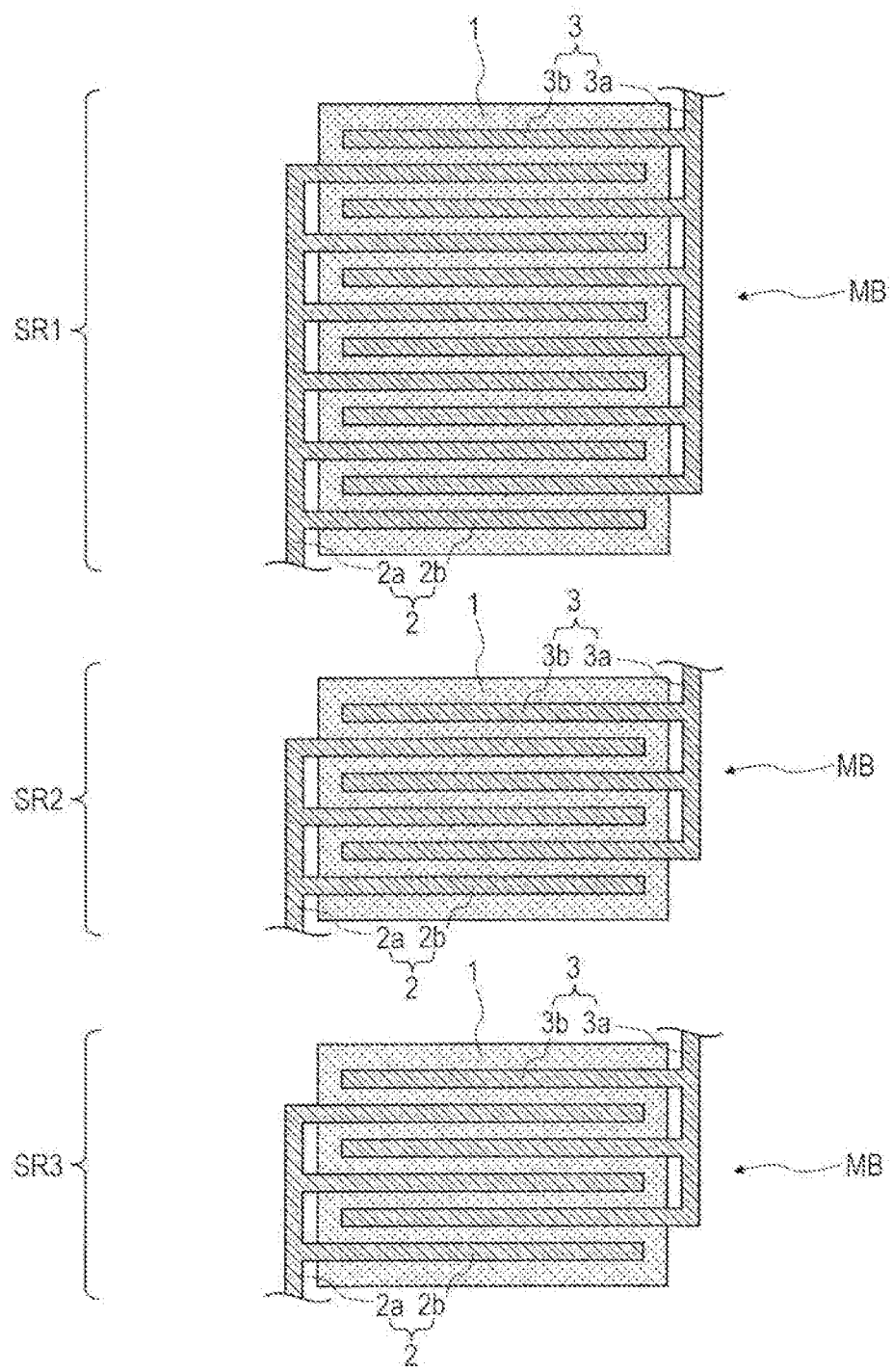
FIG. 10 is a diagram showing another exemplary arrangement of the set transistor MB.

FIG. 10 shows another exemplary arrangement of the set transistor MB. Both the drain terminal 2 and the source terminal 3 of the set transistor MB again have a comb-teeth structure in the example shown in FIG. 10. The drain terminal 2 includes a main portion 2a extending in the column direction and a plurality of branch portions (comb-teeth portions) 2b extending off the main portion 2a in the row direction. The source terminal 3 includes a main portion 3a extending in the column direction and a plurality of branch portions (comb-teeth portions) 3b extending off the main portion 3a in the row direction. The drain terminal 2 and the source terminal 3 are disposed such that the comb-teeth portions 2b and 3b thereof alternate with each other. The comb-teeth portions 2b and 3b in the example shown in FIG. 10 extend in different directions than the comb-teeth portions 2b and 3b in the example shown in FIG. 9 as described here.

In the example shown in FIG. 10, the set transistor MB in the first stage again has a different dimension in the column direction than the set transistors MB in the second and subsequent stages. Specifically, the set transistor MB in the first stage has a larger column-wise dimension than the set transistors MB in the second and subsequent stages. In addition, in the row direction (direction substantially perpendicular to the column direction), the set transistor MB in the first stage has substantially the same dimension as the set transistors MB in the second and subsequent stages.

When the set transistor MB in the first stage and the set transistors MB in the second and subsequent stages have substantially the same row-wise dimension as shown in the example in FIG. 10, effects can be achieved that are similar to those achieved in the example shown in FIG. 9.

In the example shown in FIG. 10, the set transistor MB in the first stage has a larger channel width than the set transistors MB in the second and subsequent stages because the set transistor MB in the first stage has a larger tooth count than the set transistors MB in the second and subsequent stages.

As described here, in increasing the current-drive capability of a particular one of the set transistors MB beyond the current-drive capability of another one of the set transistors MB, the channel width can be increased without having to change the row-wise dimension, by setting only either the tooth lengths thereof or the tooth counts thereof to different values. Specifically, the channel width can be changed without having to change the row-wise dimension of a set transistor MB, by changing the tooth length thereof when the comb-teeth portions 2b and 3b extend in the column direction and changing the tooth count thereof when the comb-teeth portions 2b and 3b extend in the row direction.

Embodiment 2

Figure 11:
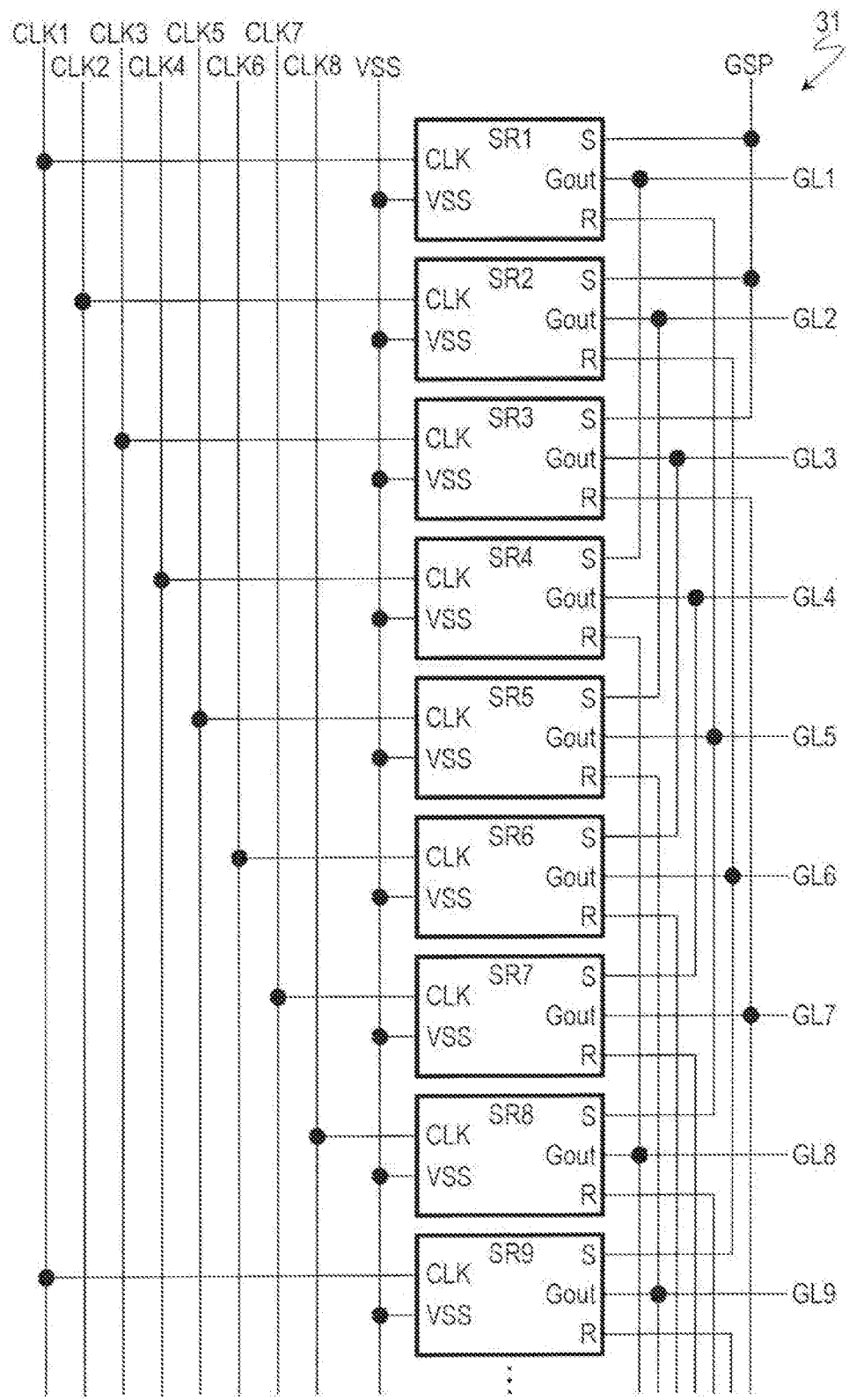
FIG. 11 is a block diagram of a structure of a shift register circuit 31 in a gate driver 30 in a liquid crystal display device in accordance with Embodiment 2.
Figure 12:
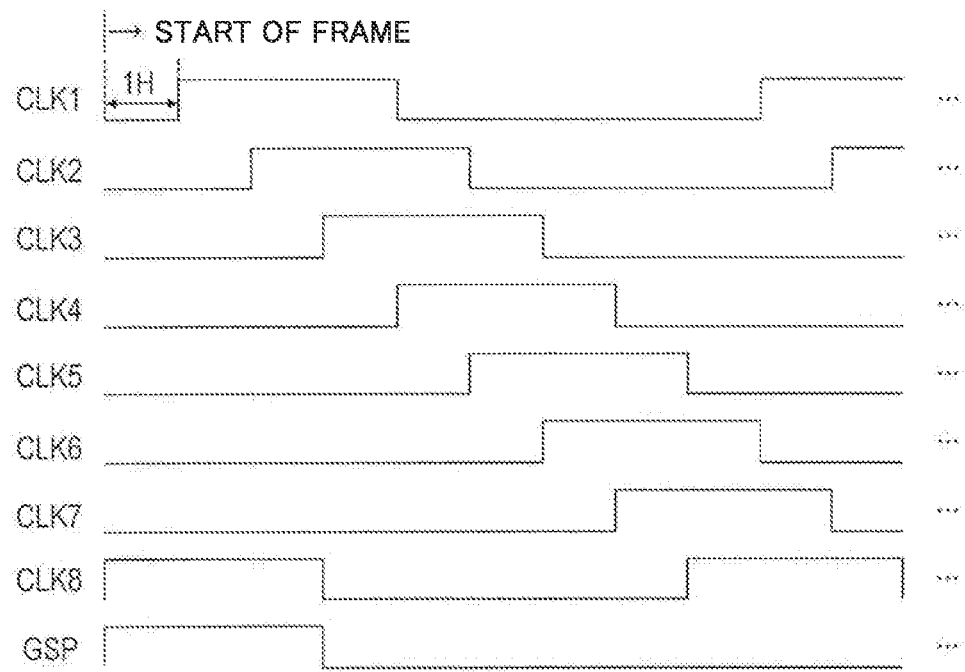
FIG. 12 is a timing chart illustrating how the gate driver 30 operates in accordance with Embodiment 2.
Figure 12:
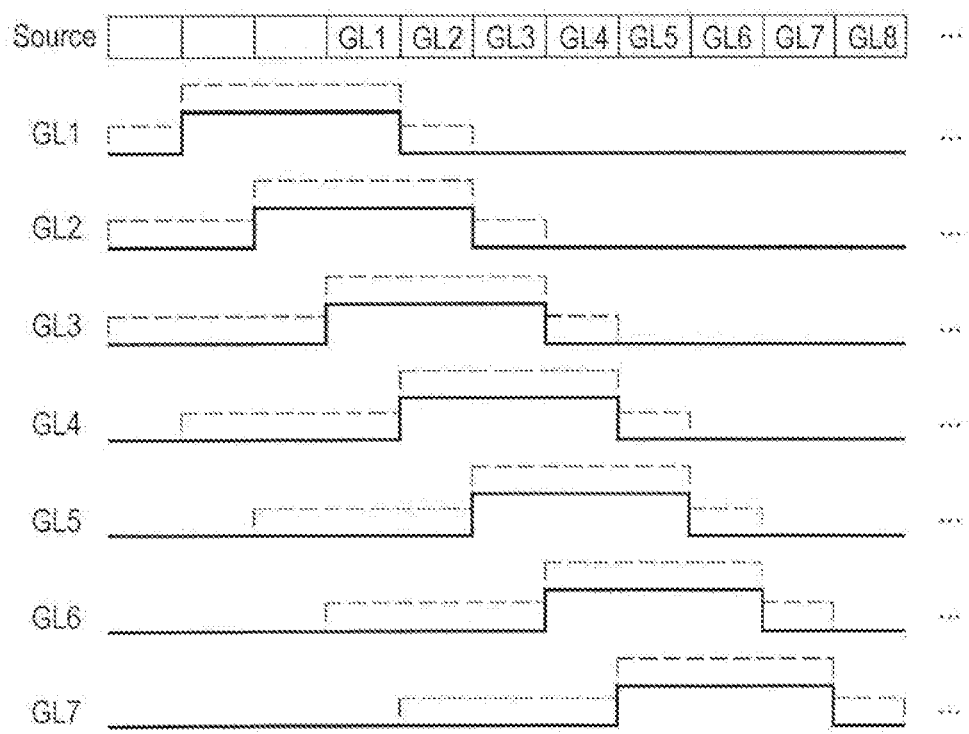

Referring to FIGS. 11 and 12, a description is given of a liquid crystal display device in accordance with the present embodiment. FIG. 11 is a block diagram of a structure of a shift register circuit 31 in accordance with the present embodiment. FIG. 12 is a timing chart illustrating how the gate driver 30 operates in accordance with the present embodiment. The following description will focus on differences between the liquid crystal display device in accordance with the present embodiment and the liquid crystal display device 100 in accordance with Embodiment 1.

FIG. 11 shows the unit circuits SR1 to SR9 in the first to ninth stages from the plurality of unit circuits SR1 to SRi in the shift register circuit 31. The shift register circuit 31 shown in FIG. 11 is fed with eight-phase clock signals CLK1 to CLK8 as the gate clock signals CLK. In this example, the clock signals CLK1 to CLK8 toggle repeatedly between a HIGH potential (VDD) that lasts for three horizontal scan periods (3H) and a LOW potential (VSS) that lasts for five horizontal scan periods (5H) and have respective phases that differ by one-eighth of the cycle (45°) (see FIG. 12). In other words, each stage in the shift register circuit 31 selects an associated one of the gate bus lines GL for a select period that is longer than one horizontal scan period (in this example, the select period is equal to three horizontal scan periods).

The clock signals CLK1 to CLK8 are supplied to the unit circuits SR1 to SR8 in the first to eighth stages respectively. The same configuration repeats every eight stages throughout the rest of the shift register circuit 31.

Each unit circuit SR outputs the scan signal Gout. To each unit circuit SR4 to SRi in the fourth and subsequent stages, the scan signal Gout outputted from the third previous stage is supplied as the set signal S. Meanwhile, a gate start pulse signal GSP is supplied to the unit circuits SR1, SR2, and SR3 in the first, second, and third stages as the set signal S.

To the unit circuit SR in each stage, the scan signal Gout outputted from the fourth succeeding stage is supplied as the reset signal R.

As can be seen from FIG. 12, the select period over which each gate bus line GL remains selected is longer than one horizontal scan period and equal to three horizontal scan periods, so that the select periods for every two adjacent gate bus lines GL partially (two horizontal scan periods) overlap.

In addition, as shown in FIG. 12, the period over which the internal node netA in the unit circuit SR1 in the first stage is precharged by the set transistor MB (referred to as the "first precharge period") and the period over which the internal node netA in the unit circuit SR2 in the second stage is precharged by the set transistor MB (referred to as the "second precharge period") are shorter than the period over which the internal node netA in each unit circuit SR3 to SRi in the third and subsequent stages is precharged by the set transistor MB (referred to as the "third precharge period"). Additionally, the first precharge period is shorter than the second precharge period. Specifically, the third precharge period is equal to three horizontal scan periods, the second precharge period is equal to two horizontal scan periods, and the first precharge period is equal to one horizontal scan period.

The set transistor MB in the unit circuit SR1 in the first stage and the set transistor MB in the unit circuit SR2 in the second stage differ in current-drive capability from the set transistors MB in the unit circuits SR3 to SRi in the third and subsequent stages in the present embodiment. Specifically, the current-drive capabilities of the set transistors MB in the first and second stages are higher than the current-drive capability in the set transistors MB in the third and subsequent stages. Additionally, the current-drive capability of the set transistor MB in the first stage is higher than the current-drive capability of the set transistor MB in the second stage.

The liquid crystal display device in accordance with the present embodiment is driven by overlap scan drive where the pulse width of the scan signal Gout is stretched as described above. This particular configuration can address the problem of insufficient charging of the gate bus lines GL and the pixels P.

Figure 13:
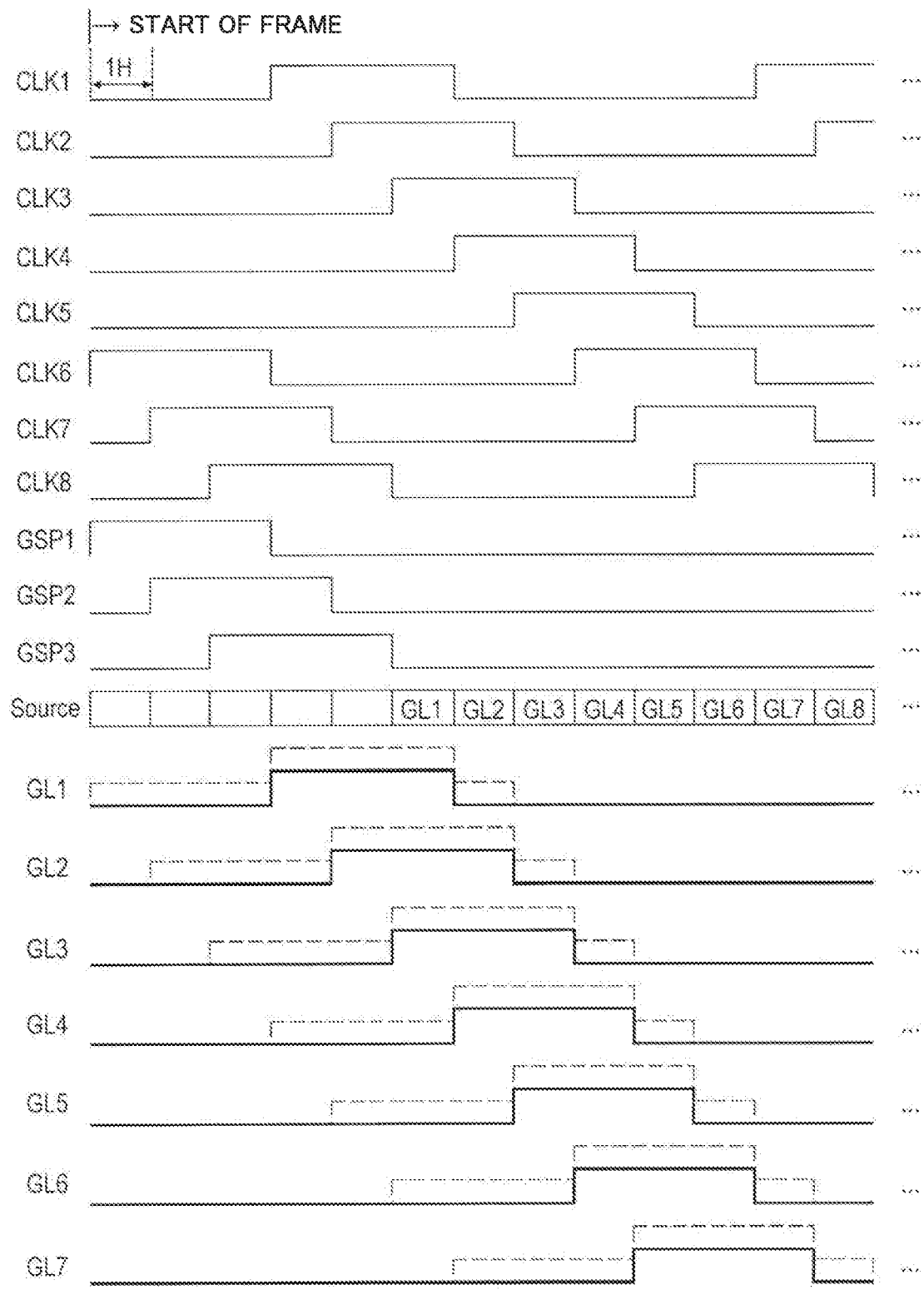
FIG. 13 is a timing chart illustrating simple overlap scan drive when the select period is equal to three horizontal scan periods.

The precharge period for the internal node netA in the first stage (first precharge period) and the precharge period for the internal node netA in the second stage (second precharge period) are shorter than the precharge period for the internal nodes netA in the third and subsequent stages (third precharge period) in the present embodiment. FIG. 13 is a timing chart illustrating simple overlap scan drive when the select period is equal to three horizontal scan periods. The timing chart in FIG. 13 shows the precharge period for the internal node netA having the same duration in all stages (equal to three horizontal scan periods). A comparison of FIGS. 12 and 13 demonstrates that this particular configuration of the present embodiment where the precharge period for the internal node netA in the first stage (first precharge period) and the precharge period for the internal node netA in the second stage (second precharge period) are shorter than the precharge period for the internal nodes netA in the third and subsequent stages (third precharge period) can shorten the time lapse from the start of a frame to the writing of a source signal in the first stage. The configuration can therefore restrain increases in the line memory count.

In the timing chart in FIG. 13, a gate start pulse signal GSP1, a gate start pulse signal GSP2, and a gate start pulse signal GPS3 need to be used for the first, second, and third stages respectively. In contrast, in the present embodiment, the single gate start pulse signal GSP can drive all the first, second, and third stages because the set signal S goes HIGH (precharging is started) at the same timing in the first, second, and third stages.

The current-drive capabilities of the set transistors MB in the unit circuits SR1 and SR2 in the first and second stages are higher than the current-drive capabilities of the set transistors MB in the unit circuits SR3 to SRi in the third and subsequent stages in the present embodiment. This particular configuration can sufficiently raise the voltage on the internal node netA in the first and second stages, thereby maintaining the output level of the scan signal Gout, even when the precharge period is short.

Letting $L_{MB1}$ and $W_{MB1}$ represent the channel length and the channel width respectively of the set transistor MB in the first stage and $L_{MB3}$ and $W_{MB3}$ represent the channel length and the channel width respectively of the set transistors MB in the third and subsequent stages when the precharge period for the internal node netA in the first stage is $x_1$ times the precharge period for the internal nodes netA in the third and subsequent stages, where $x_1$ is greater than 0 and less than 1, it is preferable to set $L_{MB1}$ and $W_{MB1}$ so as to satisfy equation (2) below.

$$x_1 = (L_{MB1}/L_{MB3}) \times (W_{MB3}/W_{MB1}) \quad (2)$$

Letting $L_{MB2}$ and $W_{MB2}$ represent the channel length and the channel width respectively of the set transistor MB in the second stage when the precharge period for the internal node netA in the second stage is $x_2$ times the precharge period for the internal nodes netA in the third and subsequent stages, where $x_2$ is greater than 0 and less than 1, it is preferable to set $L_{MB2}$ and $W_{MB2}$ so as to satisfy equation (3) below.

$$x_2 = (L_{MB2}/L_{MB3}) \times (W_{MB3}/W_{MB2}) \quad (3)$$

As described by way of example above, when the precharge period for the internal node netA in the first stage is one third of the precharge period for the internal nodes netA in the third and subsequent stages, the set transistor MB in the first stage can raise the voltage on the internal node netA to the same level as in the third and subsequent stages if the set transistor MB in the first stage is capable of charging the internal node netA with electric charge $Q1=3 \times Q$ per unit time. By setting $L_{MB1}$ and $W_{MB1}$ so as to satisfy $1/3 = (L_{MB1}/L_{MB3}) \times (W_{MB3}/W_{MB1})$, the desired quantity of charge Q1 can be achieved.

When the precharge period for the internal node netA in the second stage is two-thirds of the precharge period for the internal nodes netA in the third and subsequent stages, the set transistor MB in the second stage can raise the voltage on the internal node netA to the same level as in the third and subsequent stages if the set transistor MB in the second stage is capable of charging the internal node netA with electric charge $Q2=(3/2) \times Q$ per unit time. By setting $L_{MB2}$ and $W_{MB2}$ so as to satisfy $2/3 = (L_{MB2}/L_{MB3}) \times (W_{MB3}/W_{MB2})$, the desired quantity of charge Q2 can be achieved.

Embodiment 3

Figure 14:
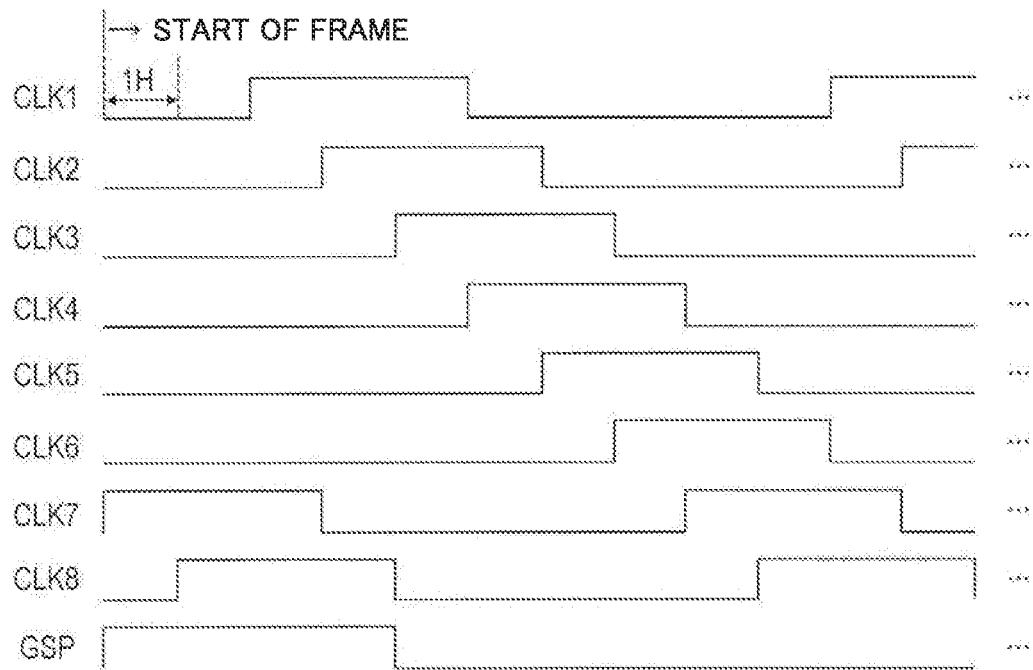
FIG. 14 is a timing chart illustrating how the gate driver 30 operates in accordance with Embodiment 3.
Figure 14:
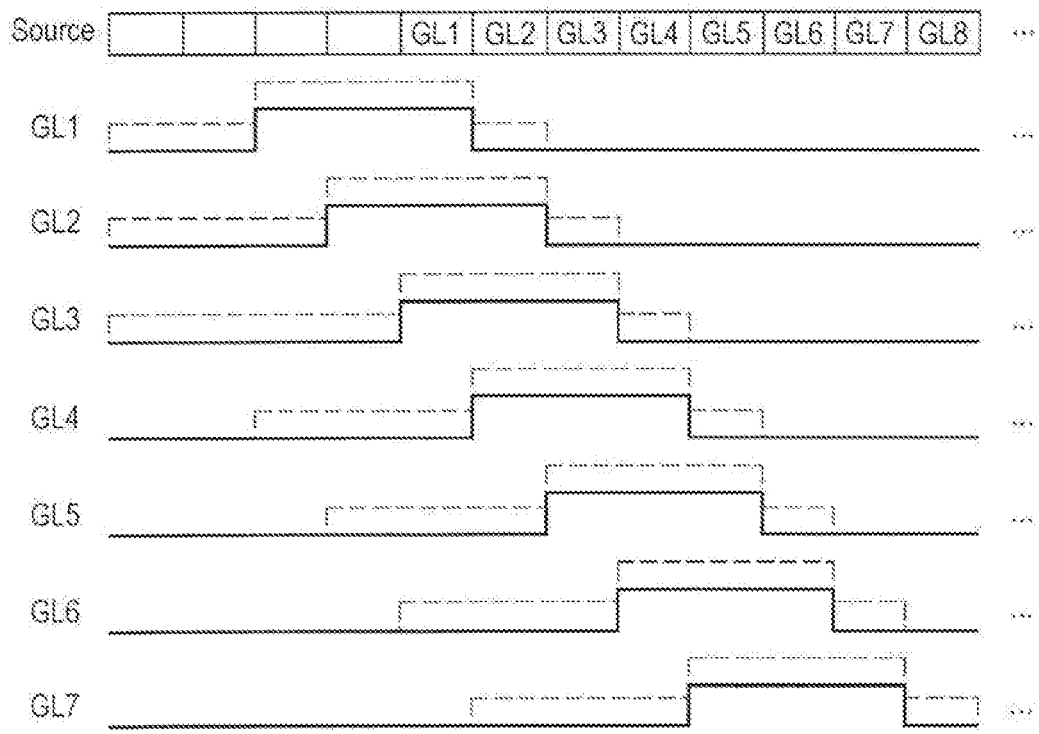

Referring to FIG. 14, a description is given of a liquid crystal display device in accordance with the present embodiment. FIG. 14 is a timing chart illustrating how a gate driver 30 operates in accordance with the present embodiment. The following description will focus on differences between the liquid crystal display device in accordance with the present embodiment and the liquid crystal display device in accordance with Embodiment 2. A shift register circuit 31 in accordance with the present embodiment has the same structure as the structure shown in FIG. 11.

As can be seen from FIG. 14, the select period over which each gate bus line GL remains selected is longer than one horizontal scan period and equal to three horizontal scan periods, so that the select periods for every two adjacent gate bus lines GL partially (two horizontal scan periods) overlap.

In addition, as shown in FIG. 14, the period over which the internal node netA in the unit circuit SR1 in the first stage is precharged by the set transistor MB (referred to as the "first precharge period") is shorter than the period over which the internal nodes netA in the unit circuits SR2 and SR4 to SRi in the second, fourth, and subsequent stages are precharged by the set transistors MB respectively (referred to as the "second precharge period"). Additionally, the period over which the internal node netA in the unit circuit SR3 in the third stage is precharged by the set transistor MB (referred to as the "third precharge period") is longer than the second precharge period. Specifically, the second precharge period is equal to three horizontal scan periods, the first precharge period is equal to two horizontal scan periods, and the third precharge period is equal to four horizontal scan periods. In other words, the precharge period is shortened in the first stage and stretched in the third stage.

The set transistor MB in the unit circuit SR1 in the first stage, the set transistors MB in the unit circuits SR2 and SR4 to SRi in the second, fourth, and subsequent stages, and the set transistor MB in the unit circuit SR3 in the third stage differ in current-drive capability in the present embodiment. Specifically, the current-drive capability of the set transistor MB in the first stage is higher than the current-drive capabilities of the set transistors MB in the second, fourth, and subsequent stages. Additionally, the current-drive capability of the set transistor MB in the third stage is lower than the current-drive capabilities of the set transistors MB in the second, fourth, and subsequent stages.

The liquid crystal display device in accordance with the present embodiment is driven by overlap scan drive where the pulse width of the scan signal Gout is stretched as described above. This particular configuration can address the problem of insufficient charging of the gate bus lines GL and the pixels P.

The precharge period for the internal node netA in the first stage (first precharge period) is shorter than the precharge period for the internal nodes netA in the second, fourth, and subsequent stages (second precharge period) in the present embodiment. A comparison of FIGS. 13 and 14 demonstrates that this particular configuration of the present embodiment where the precharge period for the internal node netA in the first stage (first precharge period) is shorter than the precharge period for the internal nodes netA in the second, fourth, and subsequent stages (second precharge period) can shorten the time lapse from the start of a frame to the writing of a source signal in the first stage. The configuration can therefore restrain increases in the line memory count.

In the timing chart in FIG. 13, a gate start pulse signal GSP1, a gate start pulse signal GSP2, and a gate start pulse signal GPS3 need to be used for the first, second, and third stages respectively. In contrast, in the present embodiment, the single gate start pulse signal GSP can drive all the first, second, and third stages because the set signal S goes HIGH (precharging is started) at the same timing in the first, second, and third stages.

The current-drive capability of the set transistor MB in the unit circuit SR1 in the first stage is higher than the current-drive capabilities of the set transistors MB in the unit circuits SR2 and SR4 to SRi in the second, fourth, and subsequent stages in the present embodiment. This particular configuration can sufficiently raise the voltage on the internal node netA in the first stage, thereby maintaining the output level of the scan signal Gout, even when the precharge period is short.

The current-drive capability of the set transistor MB in the unit circuit SR3 in the third stage is lower than the current-drive capabilities of the set transistors MB the unit circuits SR2 and SR4 to SRi in the second, fourth, and subsequent stages in the present embodiment. This particular configuration can match the charging capability of the set transistor MB in the third stage for which the precharge period is longer than for other stages with the charging capabilities of the set transistors MB in the other stages. The configuration can hence eliminate output differences from the adjacent stages, thereby restraining the occurrence of non-uniform displays.

Letting $L_{MB1}$ and $W_{MB1}$ represent the channel length and the channel width respectively of the set transistor MB in the first stage and $L_{MB2}$ and $W_{MB2}$ represent the channel length and the channel width respectively of the set transistors MB in the second, fourth, and subsequent stages when the precharge period for the internal node netA in the first stage is $x_3$ times the precharge period for the internal nodes netA in the second, fourth, and subsequent stages, where $x_3$ is greater than 0 and less than 1, it is preferable to set $L_{MB1}$ and $W_{MB1}$ so as to satisfy equation (4) below.

$$x_3 = (L_{MB1}/L_{MB2}) \times (W_{MB2}/W_{MB1}) \quad (4)$$

Letting $L_{MB3}$ and $W_{MB3}$ represent the channel length and the channel width respectively of the set transistor MB in the third stage when the precharge period for the internal node netA in the third stage is $x_4$ times the precharge period for the internal nodes netA in the second, fourth, and subsequent stages, where $x_4$ is greater than 1, it is preferable to set $L_{MB3}$ and $W_{MB3}$ so as to satisfy equation (5) below.

$$x_4 = (L_{MB3}/L_{MB2}) \times (W_{MB2}/W_{MB3}) \quad (5)$$

As described by way of example above, when the precharge period for the internal node netA in the first stage is two-thirds of the precharge period for the internal nodes netA in the second, fourth, and subsequent stages, the set transistor MB in the first stage can raise the voltage on the internal node netA to the same level as in the second, fourth, and subsequent stages if the set transistor MB in the first stage is capable of charging the internal node netA with $Q1=(\frac{2}{3}) \times Q$ per unit time. By setting $L_{MB1}$ and $W_{MB1}$ so as to satisfy $\frac{2}{3}=(L_{MB1}/L_{MB2}) \times (W_{MB2}/W_{MB1})$, the desired quantity of charge Q1 can be achieved.

When the precharge period for the internal node netA in the third stage is four-thirds of the precharge period for the internal nodes netA in the second, fourth, and subsequent stages, the set transistor MB in the third stage can raise the voltage on the internal node netA to the same level as in the second, fourth, and subsequent stages if the set transistor MB in the third stage is capable of charging the internal node netA with electric charge $Q2=(\frac{3}{4}) \times Q$ per unit time. By setting $L_{MB3}$ and $W_{MB3}$ so as to satisfy $\frac{4}{3}=(L_{MB3}/L_{MB2}) \times (W_{MB2}/W_{MB3})$, the desired quantity of charge Q2 can be achieved.

The present invention, in an embodiment thereof, can provide a scan signal line drive circuit capable of restraining increases in the line memory count and achieving suitable driving even when the pulse width of a scan signal is stretched, as described above.

Embodiments 1 to 3 discussed examples where the select period is equal to two horizontal scan periods or three horizontal scan periods. The select period does not necessarily have these lengths. Alternatively, the select period may be greater than or equal to four horizontal scan periods.

Embodiments 1 to 3 discussed examples where one or two stages have a non-ordinary precharge period (there is/are one or two non-ordinary stages). The embodiments of the present invention are not necessarily limited to these examples. For instance, when the select period is greater than or equal to four horizontal scan periods, there may be three or more non-ordinary stages.

Embodiments 2 and 3 discussed examples where the set transistors MB in all non-ordinary stages have a different current-drive capability than the set transistors MB in the ordinary stages. Alternatively, the set transistors MB in some non-ordinary stages may only have a different current-drive capability than the set transistors MB in the ordinary stages. For instance, in the liquid crystal display device in accordance with Embodiment 2, the set transistor MB in the first stage may have a higher current-drive capability than the set transistors MB in the ordinary stages (third and subsequent stages), and the set transistor MB in the second stage may have substantially the same current-drive capability as the set transistors MB in the ordinary stage. Similarly, in the liquid crystal display device in accordance with Embodiment 3, the set transistor MB in the first stage may have a higher current-drive capability than the set transistors MB in the ordinary stages (second, fourth, and subsequent stages), and the set transistor MB in the third stage may have substantially the same current-drive capability as the set transistors MB in the ordinary stages.

When there are two or more non-ordinary stages, the non-ordinary stages may include two or more stages that have an equal precharge period. For instance, when the first and second stages are non-ordinary stages, and the third and subsequent stages are ordinary stages, the first and second stages may have an equal precharge period that is shorter than the ordinary precharge period. For instance, when a driving method is used where there are provided two source bus lines SL for each column of pixels and two adjacent rows of pixels are simultaneously selected (so-called double source drive), the precharge periods for the first and second stages may be equal. Additionally, the set transistors MB in all the two or more non-ordinary stages with equal precharge periods may have a different current-drive capability than the set transistors MB in the ordinary stages. Alternatively, the set transistors MB in some of the two or more non-ordinary stages with equal precharge periods may only have a different current-drive capability than the set transistors MB in the ordinary stages.

The specific structure of each unit circuit SR is not necessarily limited to the example shown in FIG. 4. As an alternative example, each unit circuit SR may include four or more TFTs and/or two or more capacitors.

While there have been described what are at present considered to be certain embodiments of the application, it will be understood that various modifications may be made thereto, and it is intended that the appended claim cover all such modifications as fall within the true spirit and scope of the application.

What is claimed is:
1. A scan signal line drive circuit that sequentially turns a plurality of scan signal lines in a display device into a selected state, the scan signal line drive circuit comprising a shift register circuit including a plurality of stages each including a unit circuit, the unit circuit including:
an output transistor connected to an associated one of the plurality of scan signal lines to output a scan signal to the associated one of the plurality of scan signal lines;
an internal node connected to a gate terminal of the output transistor; and
a set transistor configured to precharge the internal node, two of the plurality of scan signal lines that are adjacent to each other turn into a selected state for respective, but partially overlapping select periods, the internal node is precharged over a first precharge period by a first transistor that is the set transistor in the unit circuit in at least one of the plurality of stages, the internal node is precharged over a second precharge period by a second transistor that is the set transistor in the unit circuit in at least another one of the plurality of stages, the first precharge period being shorter than the second precharge period, the first transistor in the unit circuit in some or all of the at least one of the plurality of stages having a higher current-drive capability than the second transistor in the unit circuit in the at least another one of the plurality of stages, wherein the first precharge period is x times the second precharge period, where x is greater than 0 and less than 1, and letting $L_{MB1}$ and $W_{MB1}$ represent a channel length and a channel width respectively of the first transistor that has the higher current-drive capability than the second transistor and $L_{MB2}$ and $W_{MB2}$ represent a channel length and a channel width respectively of the second transistor, a relation given below is substantially satisfied:

$$x = (L_{MB1}/L_{MB2}) \times (W_{MB2}/W_{MB1}).$$

2. The scan signal line drive circuit according to claim 1, wherein:
the second transistor and the first transistor that has the higher current-drive capability than the second transistor have substantially equal channel lengths, and
the first transistor that has the higher current-drive capability than the second transistor has a larger channel width than the second transistor.

3. The scan signal line drive circuit according to claim 1, wherein
the plurality of stages is arranged in a first direction,
the first transistor that has the higher current-drive capability than the second transistor has a different dimension in the first direction than does the second transistor in the first direction, and
the second transistor and the first transistor that has the higher current-drive capability than the second transistor have substantially equal dimensions in a second direction that is substantially perpendicular to the first direction.

4. The scan signal line drive circuit according to claim 3, wherein
the first transistor and the second transistor each have a source terminal and a drain terminal, each of the source terminal of the first transistor, the source terminal of the second transistor, the drain terminal of the first transistor, and the drain terminal of the second transistor having a comb-teeth structure, the comb-teeth structure including a main portion extending in the second direction and a plurality of branch portions extending off the main portion in the first direction, the plurality of branch portions of each of the source terminal of the first transistor, the source terminal of the second transistor, the drain terminal of the first transistor, and the drain terminal of the second transistor has a length termed a tooth length and a total number termed a tooth count, the tooth count in the first transistor that has the higher current-drive capability than the second transistor is equal to the tooth count in the second transistor, and the tooth length in the first transistor that has the higher current-drive capability than the second transistor differs from the tooth length in the second transistor.

5. The scan signal line drive circuit according to claim 3, wherein
the first transistor and the second transistor each have a source terminal and a drain terminal, each of the source terminal of the first transistor, the source terminal of the second transistor, the drain terminal of the first transistor, and the drain terminal of the second transistor having a comb-teeth structure including a main portion extending in the first direction and a plurality of branch portions extending off the main portion in the second direction,
the plurality of branch portions of each of the source terminal of the first transistor, the source terminal of the second transistor, the drain terminal of the first transistor, and the drain terminal of the second transistor has a length termed a tooth length and a total number termed a tooth count,
the tooth length in the first transistor that has the higher current-drive capability than the second transistor is equal to the tooth length in the second transistor, and
the tooth count in the first transistor that has the higher current-drive capability than the second transistor differs from the tooth count in the second transistor.

6. The scan signal line drive circuit according to claim 1, wherein a common gate start pulse signal is fed as a set signal to the set transistors including the first transistor.

7. The scan signal line drive circuit according to claim 1, wherein
the first transistor is the set transistor in the unit circuit in a first one of the plurality of stages, and
the second transistor is the set transistor in each unit circuit in second and subsequent ones of the plurality of stages.

8. The scan signal line drive circuit according to claim 1, the scan signal line drive circuit being provided monolithically to a substrate in the display device.

9. The display device comprising the scan signal line drive circuit according to claim 1.

10. A scan signal line drive circuit that sequentially turns a plurality of scan signal lines in a display device into a selected state, the scan signal line drive circuit comprising a shift register circuit including a plurality of stages each including a unit circuit,
the unit circuit including:
an output transistor connected to an associated one of the plurality of scan signal lines to output a scan signal to the associated one of the plurality of scan signal lines;
an internal node connected to a gate terminal of the output transistor; and
a set transistor configured to precharge the internal node,
two of the plurality of scan signal lines that are adjacent to each other being turned into a selected state for respective, but partially overlapping select periods,
the internal node being precharged over a first precharge period by a first transistor that is the set transistor in the unit circuit in at least one of the plurality of stages,
the internal node being precharged over a second precharge period by a second transistor that is the set transistor in the unit circuit in at least another one of the plurality of stages, the first precharge period being shorter than the second precharge period,
the first transistor in the unit circuit in some or all of the at least one of the plurality of stages having a higher current-drive capability than the second transistor in the unit circuit in the at least another one of the plurality of stages, wherein
the first transistor is the set transistor in the unit circuit in a first one of the plurality of stages,
the second transistor is the set transistor in each unit circuit in a second and subsequent ones of the plurality of stages,
a select period is equal to two horizontal scan periods,
the first precharge period is equal to one horizontal scan period, and
the second precharge period is equal to two horizontal scan periods.

11. The display device comprising the scan signal line drive circuit according to claim 10.

12. A scan signal line drive circuit that sequentially turns a plurality of scan signal lines in a display device into a selected state, the scan signal line drive circuit comprising a shift register circuit including a plurality of stages each including a unit circuit,
the unit circuit including:
an output transistor connected to an associated one of the plurality of scan signal lines to output a scan signal to the associated one of the plurality of scan signal lines;
an internal node connected to a gate terminal of the output transistor; and
a set transistor configured to precharge the internal node,
wherein:
two of the plurality of scan signal lines that are adjacent to each other turn into a selected state for respective, but partially overlapping select periods,
the internal node is precharged over a first precharge period by a first transistor that is the set transistor in the unit circuit in at least one of the plurality of stages,
the internal node is precharged over a second precharge period by a second transistor that is the set transistor in the unit circuit in at least another one of the plurality of stages, the first precharge period being shorter than the second precharge period, and
the first transistor in the unit circuit in some or all of the at least one of the plurality of stages having a higher current-drive capability than the second transistor in the unit circuit in the at least another one of the plurality of stages, wherein the internal node is precharged over a third precharge period by a third transistor that is the set transistor in the unit circuit in at least yet another one of the plurality of stages, the second precharge period being shorter than the third precharge period.

13. The scan signal line drive circuit according to claim 12, wherein
the first transistor is the set transistor in the unit circuit in a first one of the plurality of stages,
the second transistor is the set transistor in the unit circuit in a second one of the plurality of stages, the third transistor is the set transistor in each unit circuit in third and subsequent ones of the plurality of stages, and the second transistor has a higher current-drive capability than the third transistor.

14. The scan signal line drive circuit according to claim 13, wherein:

the select period is equal to three horizontal scan periods, the first precharge period is equal to one horizontal scan period, the second precharge period is equal to two horizontal scan periods, and the third precharge period is equal to three horizontal scan periods.

15. The scan signal line drive circuit according to claim 12, wherein the first transistor is the set transistor in the unit circuit in a first one of the plurality of stages, the second transistor is the set transistor in each unit circuit in second, fourth, and subsequent ones of the plurality of stages, the third transistor is the set transistor in the unit circuit in a third one of the plurality of stages, and the third transistor has a lower current-drive capability than the second transistor.

16. The scan signal line drive circuit according to claim 15, wherein:

the select period is equal to three horizontal scan periods, the first precharge period is equal to two horizontal scan periods, the second precharge period is equal to three horizontal scan periods, and the third precharge period is equal to four horizontal scan periods.

17. The scan signal line drive circuit according to claim 12, wherein the second transistor and the third transistor have substantially equal current-drive capabilities.

18. The display device comprising the scan signal line drive circuit according to claim 12.

* * * * *